US012615738B2

(12) United States Patent
Wang et al.

(10) Patent No.: US 12,615,738 B2
(45) Date of Patent: Apr. 28, 2026

(54) ELECTRIC CONTROL BOX AND AIR CONDITIONING SYSTEM

(71) Applicants:GD Midea Heating & Ventilating Equipment Co., Ltd., Foshan (CN); Midea Group Co., Ltd., Foshan (CN)

(72) Inventors: Guochun Wang, Foshan (CN); An Xu, Foshan (CN); Mingren Wang, Foshan (CN); Huadong Luo, Foshan (CN)

(73) Assignees: GD MIDEA HEATING & VENTILATING EQUIPMENT CO., LTD., Foshan (CN); MIDEA GROUP CO., LTD., Foshan (CN)

( * ) Notice: Subject to any disclaimer, the term of this patent is extended or adjusted under 35 U.S.C. 154(b) by 151 days.

(21) Appl. No.: 18/231,118

(22) Filed: Aug. 7, 2023

(65) Prior Publication Data

US 2023/0375218 A1     Nov. 23, 2023

Related U.S. Application Data

(63) Continuation of application No. PCT/CN2021/122414, filed on Sep. 30, 2021.

(30) Foreign Application Priority Data

Feb. 8, 2021     (CN) ......................... 202120351621.X

(51) Int. Cl.
  *H05K 7/20*          (2006.01)
  *F24F 11/88*          (2018.01)
        (Continued)

(52) U.S. Cl.
  CPC .......... *H05K 7/20272* (2013.01); *F24F 11/88* (2018.01); *F24F 11/89* (2018.01);
        (Continued)

(58) Field of Classification Search
  CPC .......... F24F 11/88; F24F 11/89; F24F 13/222; F24F 13/30; F24F 1/22; F24F 1/24;
        (Continued)

(56) References Cited

U.S. PATENT DOCUMENTS 4,756,475 A     7/1988  Vergne
5,333,460 A     8/1994  Lewis et al.
        (Continued)

FOREIGN PATENT DOCUMENTS

CN          1542370 A  * 11/2004
CN     201904714 U     7/2011
        (Continued)

OTHER PUBLICATIONS

Midea Group Co., Ltd., Extended European Search Report, EP Patent Application No. 21924234.4, Jun. 12, 2024, 8 pgs.
        (Continued)

*Primary Examiner* — Kun Kai Ma
(74) *Attorney, Agent, or Firm* — Morgan, Lewis & Bockius LLP

(57)          ABSTRACT

An air conditioning system and an electric control box that includes: a box body, an electronic component, and a heat exchanger, wherein the box body is provided with a mounting cavity; the electronic component is provided inside the mounting cavity. The heat exchanger includes a heat exchange body and a collecting tube assembly; the collecting tube assembly is configured to provide a refrigerant flow for the heat exchange body; the heat exchange body is configured to dissipate heat of the electronic component; and a deflector provided below the heat exchanger is configured to collect condensate dripping from the heat exchanger. The electric control box is configured to collect the condensate generated by the heat exchanger to avoid short circuit of the electronic component.

19 Claims, 25 Drawing Sheets

(51) Int. Cl.
    *F24F 11/89*        (2018.01)
    *F24F 13/22*        (2006.01)
    *F24F 13/30*        (2006.01)

(52) U.S. Cl.
    CPC ............ *F24F 13/222* (2013.01); *F24F 13/30* (2013.01); *H05K 7/20263* (2013.01)

(58) Field of Classification Search
    CPC ..... F24F 1/32; H05K 7/20263; H05K 5/0212; H05K 7/20254; H05K 7/20309; F25B 39/00; F25B 40/02
    See application file for complete search history.

(56) References Cited

U.S. PATENT DOCUMENTS

| | | |
|---|---|---|
| 5,713,208 A | 2/1998 | Chen et al. |
| 10,006,646 B2 | 6/2018 | Kim et al. |
| 11,304,336 B2 | 4/2022 | Kim et al. |
| 2011/0271711 A1 | 11/2011 | Yoshida et al. |
| 2013/0126127 A1 | 5/2013 | Yoshimura et al. |
| 2014/0211923 A1 | 7/2014 | Chen et al. |
| 2015/0198339 A1 | 7/2015 | Jeon |
| 2016/0174411 A1 | 6/2016 | Lee et al. |
| 2018/0142908 A1 | 5/2018 | Morikawa et al. |
| 2021/0112342 A1 | 4/2021 | Xu et al. |

FOREIGN PATENT DOCUMENTS

| | | | | |
|---|---|---|---|---|
| CN | 105091258 A | * | 11/2015 | |
| CN | 106016507 A | | 10/2016 | |
| CN | 106016508 A | | 10/2016 | |
| CN | 106256176 A | | 12/2016 | |
| CN | 106852081 A | | 6/2017 | |
| CN | 107014054 A | * | 8/2017 | ............ F24F 13/222 |
| CN | 107613721 A | | 1/2018 | |
| CN | 108361814 A | | 8/2018 | |
| CN | 109959082 A | * | 7/2019 | ................ F24F 1/24 |
| CN | 109959182 A | | 7/2019 | |
| CN | 110145848 A | | 8/2019 | |
| CN | 209594153 U | * | 11/2019 | |
| CN | 210014481 U | * | 2/2020 | |
| CN | 210808085 U | | 6/2020 | |
| CN | 113710061 A | | 11/2021 | |
| CN | 214666271 U | | 11/2021 | |
| EP | 3168555 A1 | * | 5/2017 | ............ F25D 21/14 |
| EP | 3361173 A1 | | 8/2018 | |
| JP | 2006329537 A | | 12/2006 | |
| JP | 2006329538 A | | 12/2006 | |
| JP | 2008002741 A | * | 1/2008 | |
| JP | 2010078305 A | | 4/2010 | |
| JP | 5505055 B2 | | 5/2014 | |
| KR | 19980021307 U | | 7/1998 | |
| KR | 20180116679 A | | 10/2018 | |
| WO | WO 2012081056 A1 | | 6/2012 | |

OTHER PUBLICATIONS

Wang, Notice of Allowance, U.S. Appl. No. 17/922,783, Jul. 9, 2024, 9 pgs.
Midea Group Co., Ltd., ISRWO, PCT/CN2021/122414, Dec. 30, 2021, 10 pgs.
Midea Group Co., Ltd., IPRP, PCT/CN2021/122414, Aug. 3, 2023, 8 pgs.
Midea Group Co., Ltd., ISR/WO, PCT /CN2021/114356, Sep. 29, 2021, 6 pgs.
Midea Group Co., Ltd., Korean Office Action, KR Patent Application No. 10-2023-7025690, Jan. 22, 2025, 13 pgs.
Midea Group Co., Ltd., Brazilian Search Report, BR Patent Application No. BR112023000247-8, Mar. 28, 2025, 8 pgs.
Midea Group Co., Ltd., Extended European Search Report, EP Patent Application No. 21860397.5, Feb. 23, 2024, 20 pgs.
GD Midea Heating & Ventilating Equipment Co., Ltd et al., European Office Action, EP Patent Application No. 21924234.4, Aug. 29, 2025, 4 pgs.
GD Midea Heating & Ventilating Equipment Co., Ltd et al., Brazilian Search Report, BR Patent Application No. BR112023000247-8, Sep. 3, 2025, 11 pgs.

* cited by examiner

62

ELECTRIC CONTROL BOX AND AIR CONDITIONING SYSTEM

CROSS-REFERENCE TO RELATED APPLICATIONS

The present application is a continuation of International Patent Application No. PCT/CN2021/122414 filed on Sep. 30, 2021, which claims priority to Chinese Patent Application No. 202120351621. X, filed on Feb. 8, 2021, entitled "ELECTRIC CONTROL BOX AND AIR CONDITIONER SYSTEM," the contents of all of which are hereby incorporated by reference.

TECHNICAL FIELD

The present disclosure relates to the technical field of air conditioners, in particular to an electric control box and an air conditioning system.

BACKGROUND

An electric control box is generally disposed in the outdoor unit of the air conditioner. The electric control box is provided with electronic components, to detect and/or control the operating state of various components of the outdoor unit of the air conditioner. A heat exchanger dissipates heat generated in the operating process of the electronic components. Conventional heat exchanger may generate condensed water in the operation process, and dripping the condensed water may generate noise and may pose a risk of short circuits in the electronic components.

SUMMARY OF THE DISCLOSURE

A first aspect of the present disclosure provides an electric control box, the electric control box includes: a box body provided with a mounting cavity, an electronic component disposed in the mounting cavity, a heat exchanger, and a deflector. The heat exchanger includes a heat exchange body and a collecting tube assembly. The collecting tube assembly is configured to provide a refrigerant flow for the heat exchange body. The heat exchange body is configured to dissipate heat of the electronic component. The deflector is located on a lower side of the heat exchanger and configured to collect condensed water dripped from the heat exchanger.

A second aspect of the present disclosure provides an air conditioning system including the electric control box of any one of above embodiments.

BRIEF DESCRIPTION OF THE DRAWINGS

The accompanying drawings here are incorporated into the specification and form a part of this specification. These drawings illustrate embodiments in accordance with the present application and are used together with the specification to illustrate the technical solution of the present application.

DETAILED DESCRIPTION

The following will be combined with the accompanying drawings in some embodiments of the present disclosure, the technical solution in some embodiment of the present disclosure is clearly and completely described. Obviously, the described embodiments are merely a part of some embodiments of the present disclosure, and not all embodiments. Based on some embodiments of the present disclosure, all other embodiments attained by those of ordinary skill in the art without inventive effort are within the scope of the present disclosure.

Reference herein to "embodiments" means that, particular features, structures, or characteristics described in connection with embodiments may be included in at least one embodiment of the present disclosure. The phrase appearing in various positions in the specification does not necessarily refer to the same embodiment, nor is it an independent or alternative embodiment that is mutually exclusive with other embodiments. Technicians in this field explicitly and implicitly understand that the embodiments described in the present disclosure can be combined with other embodiments.

It is to be understood that the foregoing general description and the following detailed description are merely exemplary and illustrative, and are not intended to limit the present disclosure.

The present disclosure provides an electric control box and an air conditioning system. The electric control box and the air conditioning system can drain the condensed water generated by a heat exchanger and avoid short circuit of electronic components.

Figure 1:
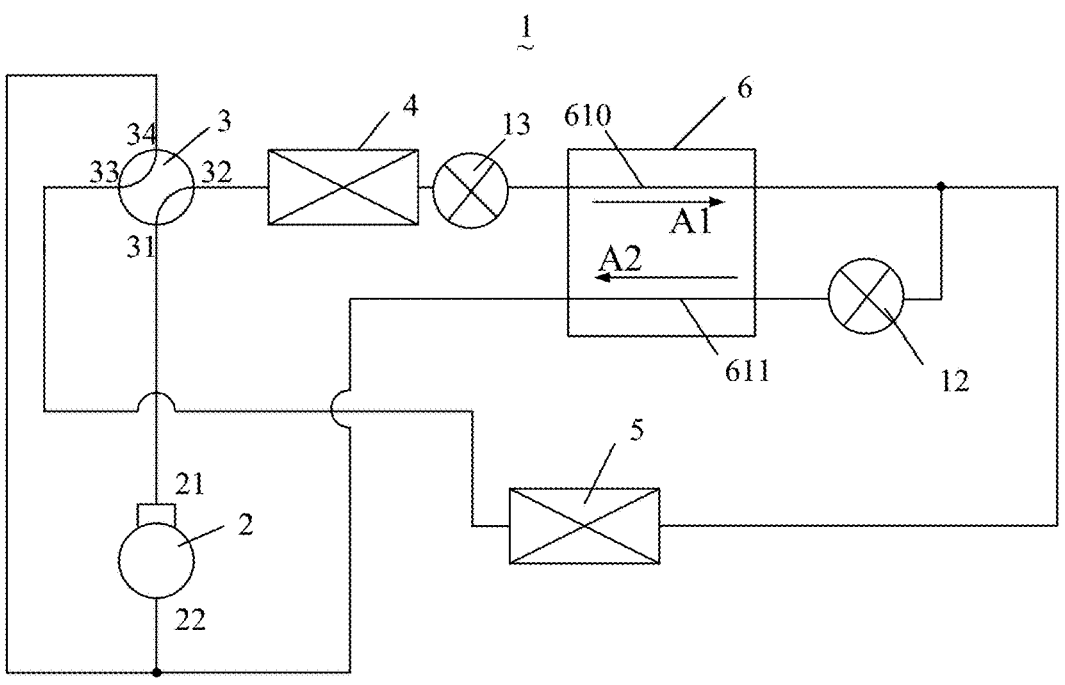
FIG. 1 is a schematic block view of some embodiments of an air conditioning system of the present disclosure.

Referring to FIG. 1, FIG. 1 is a schematic block view of some embodiments of an air conditioning, system of the present disclosure. As shown in FIG. 1, the air conditioning, system 1 mainly includes a compressor 2, a four-way valve 3, an outdoor heat exchanger 4, an indoor heat exchanger 3, a heat exchanger 6, an expansion valve 12 and an expansion valve 13. The expansion valve 13 and the heat exchanger 6 are disposed between the outdoor heat exchanger 4 and the indoor heat exchanger 5, and the compressor 2 is configured to provide a circulating refrigerant flow between the outdoor heat exchanger 4 and the indoor heat exchanger 5 through the four-way valve 3.

The heat exchanger 6 includes a first heat exchange passage 610 and a second heat exchange passage 611. A first end of the first heat exchange passage 610 is connected to the outdoor heat exchanger 4 through the expansion valve 13, and a second end of the first heat exchange passage 610 is connected to the indoor heat exchanger 5. A first end of the second heat exchange passage 611 is connected to the second end of the first heat exchange passage 610 through the expansion valve 12, and the second end of the second heat exchange passage 611 is connected to a suction port 22 of the compressor 2.

When the air conditioning system 1 is in the refrigeration mode, the path of the refrigerant flow is as follows.

An exhaust port 21 of the compressor 2—a connection port 31 of the four-way valve 3—a connection port 32 of the four-way valve 3—the outdoor heat exchanger 4—the heat exchanger 6 the indoor heat exchanger 5—a connection port 33 of the four-way valve 3—a connection port 34 of the four-way valve 3—the suction port 22 of the compressor 2.

The path (main path) of the refrigerant flow of the first heat exchange passage 610 is: the first end of the first heat exchange passage 610—the second end of the first heat exchange passage 610—the indoor heat exchanger 5. The path (auxiliary path) of the refrigerant flow of the second heat exchange passage 611 is: the second end of the first heat exchange passage 610—the expansion valve 12—the first end of the second heat exchange passage 611—the second end of the second heat exchange passage 611—the suction port 22 of the compressor 2.

In some embodiments, the operating principle of the air conditioning system at this time is: the outdoor heat exchanger 4 is used as the condenser, which outputs a medium pressure and medium temperature refrigerant flow (temperature can be 40 degrees Celsius, liquid phase refrigerant flow) through expansion valve 13. The refrigerant flow of the first heat exchange passage 610 is the medium pressure and medium temperature refrigerant flow, the expansion valve 12 converts the medium pressure and medium temperature refrigerant flow into a low pressure and low temperature refrigerant flow (temperature can be 10 degrees Celsius, gas-liquid two-phase refrigerant flow), and the refrigerant flow of the second heat exchange passage 611 is the low pressure and low temperature refrigerant flow. The low pressure and low temperature refrigerant flow of the second heat exchange passage 611 absorbs heat from the medium pressure and medium temperature refrigerant flow of the first heat exchange passage 610, so that the refrigerant flow of the second heat exchange passage 611 is vaporized, to further subcool the refrigerant flow of the first heat exchange passage 610. The refrigerant flow of the second heat exchange passage 611 after gasification increases the enthalpy of compressor 2 by injecting air, thereby improving the refrigeration capacity of air conditioning system 1.

The expansion valve 12 serves as a throttling part of the second heat exchange passage 611, to adjust a flow rate of the refrigerant flow in the second heat exchange passage 611. The refrigerant flow of the first heat exchange passage 610 and the refrigerant flow of the second heat exchange passage 611 are subjected to heat exchange, so as to realize subcooling of the refrigerant flow of the first heat exchange passage 610. Therefore, the heat exchanger 6 can be used as an economizer of the air conditioning system 1, the subcooling degree is improved, and the heat exchange efficiency of the air conditioning system 1 is further improved.

Further, in heating mode, the connecting port 31 of the four-way valve 3 is connected to the connecting port 33, and the connecting port 32 of the four-way valve 3 is connected to the connecting port 34. The refrigerant flow that is outputted from the compressor 2 through the exhaust port 21 flows from the indoor heat exchanger 5 to the outdoor heat exchanger 4, and the indoor heat exchanger 5 is used as the condenser. At the same time, the refrigerant flow outputted by the indoor heat exchanger 5 is divided into two paths, one path flows into the first heat exchange passage 610 (main path), and the other path flows into the second heat exchange passage 611 (auxiliary path) through the expansion valve 12. The refrigerant flow of the second heat exchange passage 611 can also subcool the refrigerant flow of the first heat exchange passage 610, so that the heating capacity of the air conditioner is improved.

Figure 2:
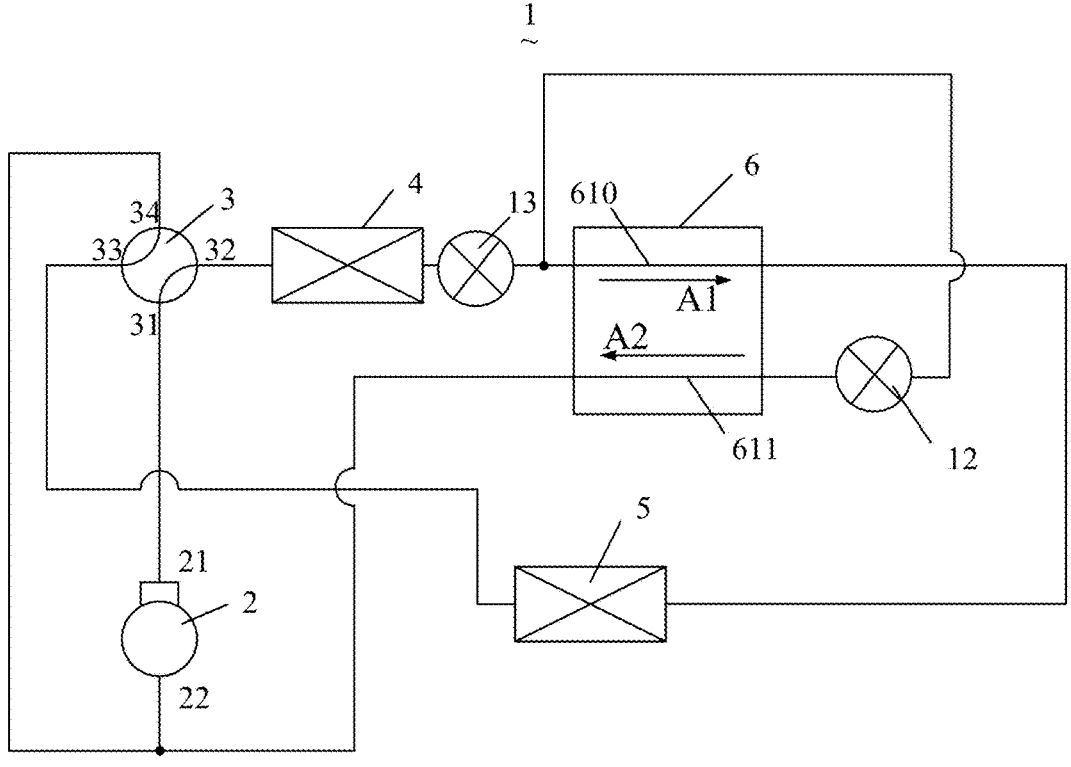
FIG. 2 is a schematic block view of some embodiments of the air conditioning system of the present disclosure.
Figure 3:
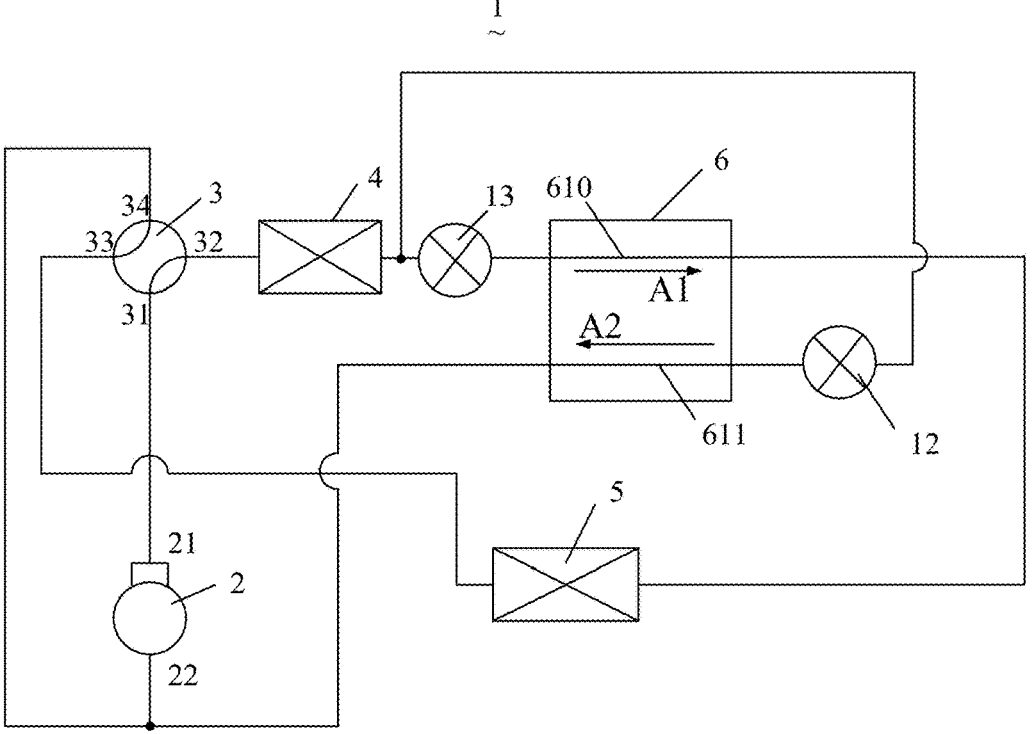
FIG. 3 is a schematic block view of some embodiments of the air conditioning system of the present disclosure.

In other embodiments, referring to FIGS. 2 and 3, the first end of the second heat exchange passage 611 may not be connected to the second end of the first heat exchange passage 610, the first end of the second heat exchange passage 611 can be directly connected to the first end of the expansion valve 13 or the second end of the expansion valve 13, so that the refrigerant flow of the first heat exchange passage 610 can be subcooled by the refrigerant flow of the second heat exchange passage 611, thereby improving the refrigeration or heating capacity of the air conditioning system 1.

Figure 4:
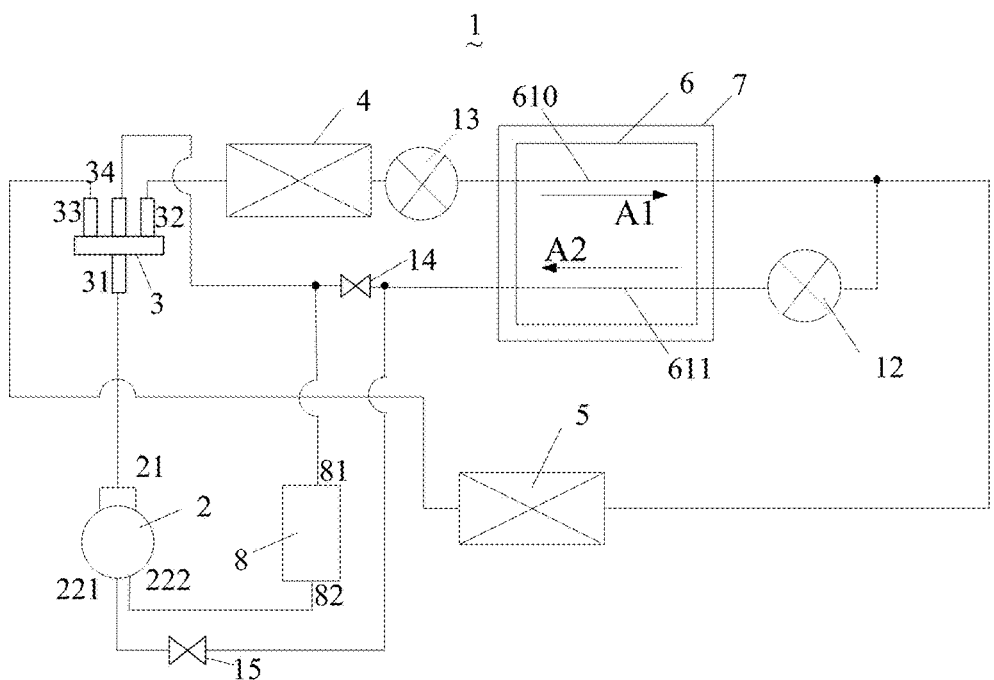
FIG. 4 is a schematic block view of some embodiments of the air conditioning system of the present disclosure.

Referring to FIG. 4, FIG. 4 is a schematic block view of some embodiments of the air conditioning system of the present disclosure. The difference between the air conditioning system 1 shown in FIG. 4 and the air conditioning system 1 shown in FIG. 1 is mainly that a gas-liquid separator 8 is added.

As in the embodiment shown in FIG. 1, the heat exchanger 6 includes the first heat exchange passage 610 through which the first refrigerant flows and a second heat exchange passage 611 through which the second refrigerant flows. The second refrigerant flow absorbs heat from the first refrigerant flow during the flow process along the second heat exchange passage 611, to cause the first refrigerant flow to be subcooled. In other embodiments, the first refrigerant flow can also absorb heat from the second refrigerant flow during the flow process along the first heat exchange passage 610, to cause the second refrigerant flow to be subcooled. Therefore, the heat exchanger 6 can serve as the economizer for the air conditioning system 1, improving subcooling and thereby improving the heat exchange efficiency of the air conditioning system 1.

In some embodiments, the suction port 22 of the compressor 2 includes an enthalpy-increasing inlet 221 and a return port 222. The second refrigerant flow flowing through the second heat exchange passage 611 is further supplied to the enthalpy-increasing inlet 221 of the compressor 2 or the inlet 81 of the gas-liquid separator 8. The outlet 82 of the gas-liquid separator 8 is further connected to the return port 222 of the compressor 2 for supplying a low-pressure gaseous refrigerant flow to the compressor 2.

Furthermore, the air conditioning system 1 also includes the four-way valve 3, the expansion valve 12, and the expansion valve 13. The expansion valve 13 and the heat exchanger 6 are disposed between the outdoor heat exchanger 4 and the indoor heat exchanger 5, and the compressor 2 provides the circulating refrigerant flow between the outdoor heat exchanger 4 and the indoor heat exchanger 5 through the four-way valve 3.

The four-way valve 3 includes the connecting port 31, the connecting port 32, the connecting port 33 and the connecting port 34. The connecting port 32 of the four-way valve 3 is connected to the outdoor heat exchanger 4, and the connecting port 34 of the four-way valve 3 is connected to the gas-liquid separator 8. The connecting port 31 of the four-way, valve 3 is connected to the compressor 2, specifically to the exhaust port 21 of the compressor 2. The connecting port 33 of the four-way valve 3 is connected to the indoor heat exchanger 5.

In the embodiments described above, the four-way valve 3 in the air conditioning system 1 is configured to realize the mutual conversion between refrigeration and heating by changing the flowing direction of refrigerant flow in the system pipeline, so that the air conditioning system 1 can be switched between a refrigeration mode and a heating mode. When the air conditioning system 1 has the refrigeration and heating functions at the same time, the four-way valve 3 can be configured to reverse.

In some embodiments, the air conditioning system 1 may also not use the four-way valve 3. When the air conditioning system 1 does not include the four-way valve 3, the compressor 2 can be directly connected to the outdoor heat exchanger 4 through a connecting pipeline. In some embodiments, the compressor 2 provides the circulating refrigerant flow between the outdoor heat exchanger 4 and the indoor heat exchanger 5 through the connecting pipeline. The heat exchanger 6 is disposed between the outdoor heat exchanger 4 and the indoor heat exchanger 5, and is communicated with the connecting pipeline. In some embodiments, when the air conditioning system 1 only has refrigeration capacity or heating capacity, the air conditioning system 1 does not use the four-way valve 3, so that the structure of the air conditioning system 1 can be simplified, and the production cost of the air conditioning system 1 is saved. In addition, when the heat exchanger 6 is not used as the economizer, the heat exchanger 6 can be communicated with the connecting pipelines at other positions.

The first end of the first heat exchange passage 610 is connected to the outdoor heat exchanger 4 through the expansion valve 13, the second end of the first heat exchange passage 610 is connected to the indoor heat exchanger 5. The first end of the second heat exchange passage 611 is connected to the second end of the first heat exchange passage 610 through the expansion valve 12. The second end of the second heat exchange passage 611 is connected to the enthalpy-increasing inlet 221 of the compressor 2 or the inlet 81 of the gas-liquid separator 8.

When the second end of the second heat exchange passage 611 is connected to the enthalpy-increasing inlet 221 of the compressor 2, the gaseous refrigerant capable of providing intermediate pressure for jet enthalpy increasing of the compressor 2 is provided, thereby improving the refrigeration and/or heating capacity of the air conditioning system 1. The principle and effect of jet enthalpy increasing belong to the understanding range of a skilled person in this field, and not described in this disclosure. When the second end of the second heat exchange passage 611 is connected to the inlet 81 of the gas-liquid separator 8, compared with the medium pressure position, the evaporation temperature of the refrigerant flow is low, the temperature difference is large, and the heat exchange efficiency of the air conditioning system 1 is further improved.

The air conditioning system 1 may also include a switching assembly. The switching assembly is configured to selectively connect the second end of the second heat exchange passage 611 to the enthalpy-increasing inlet 221 of the compressor 2 and the inlet 81 of the gas-liquid separator 8. That is, the switching assembly can be configured to selectively convey the second refrigerant flow flowing through the second heat exchange passage 611 to the enthalpy-increasing inlet 221 of the compressor 2 and the inlet 81 of the gas-liquid separator 8.

In some embodiments, the switching assembly may include a solenoid valve 15. The solenoid valve 15 is connected between the enthalpy-increasing inlet 221 of the compressor 2 and the second end of the second heat exchange passage 611, so that the solenoid valve 15 is opened when the compressor 2 requires jet enthalpy increasing, thereby providing the gaseous refrigerant that provides the intermediate pressure for the jet enthalpy increasing of the compressor 2.

The switching assembly may further include a solenoid valve 14, and the solenoid valve 14 is connected between the second end of the second heat exchange passage 611 and the inlet 81 of the gas-liquid separator 8. The solenoid valve 14 is configured to be opened when the compressor 2 does not require or is not suitable for jet enthalpy increasing, thereby guiding the second refrigerant flow output from the second end of the second heat exchange passage 611 into the gas-liquid separator 8.

The solenoid valve 15 and the solenoid valve 14 are respectively connected to the second end of the second heat exchange passage 611. The expansion valve 12 serves as the throttling part of the second heat exchange passage 611, to adjust the flow rate of the second refrigerant flow of the second heat exchange passage 611.

The refrigeration and heating principles of the air conditioning system 1 shown in FIG. 4 are substantially consistent with the refrigeration and heating principles of the air conditioning system 1 shown in FIG. 1, and will not be described further herein.

As shown in FIG. 4, the air conditioning system 1 also includes an electric control box 7. The heat exchanger 6 is connected to the electric control box 7, and the heat exchanger 6 is configured to dissipate heat of electronic components in the electric control box 7, see the description below for details. The heat exchanger 6 serves as the economizer of the air conditioning system 1 to improve the degree of subcooling, serves as a heat sink to dissipate heat of the electric control box 7, and specifically dissipates heat of the electronic components in the electric control box 7.

The present disclosure further optimizes the following aspects 1 to 11 on the basis of the overall structure of the air conditioning system 1 described above.

1. Microchannel Heat Exchanger

Figure 5:
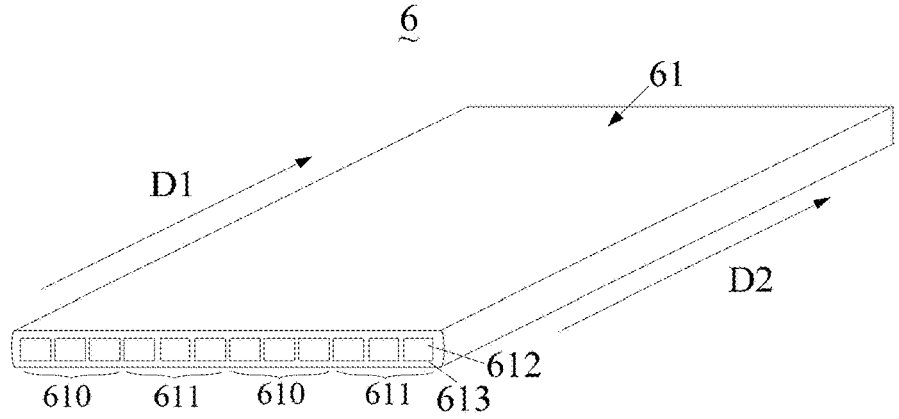
FIG. 5 is a structural schematic view of some embodiments of a heat exchange body of a heat exchanger of the present disclosure.
Figure 6:
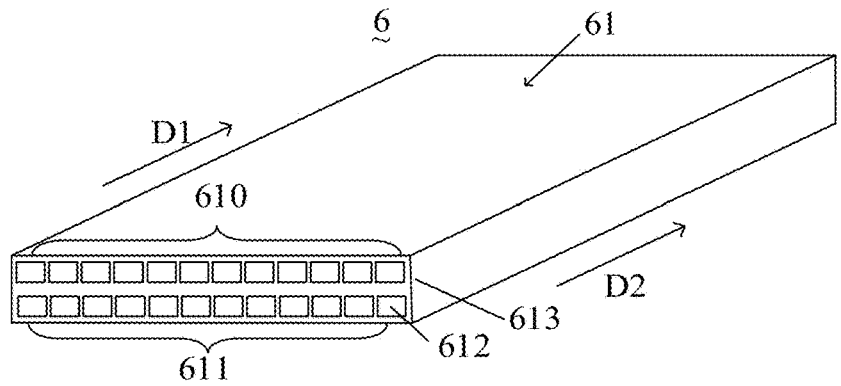
FIG. 6 is a structural schematic view of some embodiments of the heat exchange body of the heat exchanger of the present disclosure.
Figure 7:
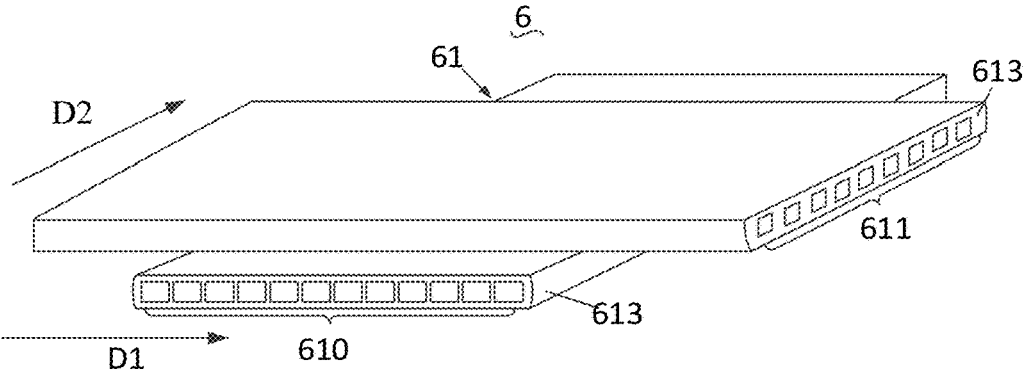
FIG. 7 is a structural schematic view of some embodiments of the heat exchange body of the heat exchanger of the present disclosure.

As shown in FIGS. 5, 6 and 7, the heat exchanger 6 includes a heat exchange body 61, and the heat exchange body 61 is provided with a plurality of microchannels 612. The plurality of microchannels 612 include a first microchannel and a second microchannel. In the air conditioning system shown in FIGS. 1 to 4, the first microchannel serves as the first heat exchange passage 610 of the heat exchanger 6, and the second microchannel serves as the second heat exchange passage 611 of the heat exchanger 6. Thus, the first microchannel 610 and the first heat exchange passage 610 use the same reference numeral, and the second microchannel 611 and the second heat exchange passage 611 use the same reference numeral. The heat exchange body 61 may include a single or multiple plate bodies 613.

The cross-sectional shape of each microchannel 612 perpendicular to the extending direction of the microchannel 612 may be rectangular. In some embodiments, each microchannel 612 has a side length of 0.5 mm to 3 mm. In some embodiments, the thickness between each microchannel 612 and the surface of the plate body 613 and the thickness between the microchannels 612 is in a range from 0.2 mm to 0.5 mm, so that the microchannels 612 meet the requirements of pressure and heat transfer performance. In other embodiments, the cross-sectional shape of the microchannels 612 may be other shapes, such as circular, triangular, trapezoidal, elliptical, or irregular.

The plurality of microchannels 612 may be configured as a single layer microchannel or a multilayer microchannel. The larger the cross-sectional area of the plurality of microchannels 612, the shorter the length of the plurality of microchannels 612 when the flow rate of the refrigerant flow is low and the flow state of the refrigerant flow is laminar; the flow resistance loss of the refrigerant flow can be reduced.

The plurality of microchannels 612 of the plate body 613 may include the first microchannels 610 and the second microchannels 611 alternately arranged. The extending direction D1 of the first microchannel 610 and the extending direction D2 of the second microchannel 611 are parallel to each other. As specifically shown in FIG. 5, the microchannels of a first preset quantity in the plurality of microchannels 612 are divided into the first microchannels 610, the microchannels of a second preset quantity in the plurality of microchannels 612 are divided into the second microchannels 611, and multiple groups of first microchannels 610 and multiple groups of second microchannels 611 are alternately arranged in sequence. That is, the second microchannel 611 is disposed between the two groups of first microchannels 610, and the first microchannel 610 is disposed between the two groups of second microchannels 611, so that the at least two groups of first microchannels 610 and the second microchannels 611 are arranged at intervals. Thus, the heat exchanger 6 with alternating arrangement of the first microchannel 610 and the second microchannel 611 is formed. The first preset quantity and the second preset quantity can be equal or unequal.

Further, in the use scenario of FIGS. 1 to 4, the first microchannel 610 and the second microchannel 611 may be independent of each other, for different refrigerant flows to flow, further, one of the refrigerant flows may be used to subcool the other refrigerant flow. In other embodiments, the first microchannel 610 and the second microchannel 611 may communicate with each other, and used as a microchannel to allow the same refrigerant flow to flow. In addition, when the first microchannel 610 and/or the second microchannel 611 are disposed in two or more layers, the first microchannel 610 and/or the second microchannel 611 in the two or more layers can be communicated with each other through a reverse collecting tube, or the plate body 613 is bent by 180 degrees to form the first microchannel 610 and/or the second microchannel 611 in the two or more layers.

In some embodiments, in some embodiments, as shown in FIG. 5, the heat exchange body 61 may include at least one group of first microchannels 610 and at least one group of second microchannels 611. The at least one group of first microchannels 610 and the at least one group of second microchannels 611 are spaced apart from each other in a width direction of the plate body 613, and the width direction of the plate body 613 is perpendicular to the extending direction of the plate body 613.

In some embodiments, as shown in FIG. 6, the at least one group of first microchannels 610 and the at least one group of second microchannels 611 may also be spaced apart from each other in a thickness direction of the plate body 613, and the thickness direction of the plate body 613 is perpendicular to the extending direction of the plate body 613.

In some embodiments, as shown in FIG. 7, the first microchannel 610 and the second microchannel 611 are independent of each other, and are respectively disposed in different plate bodies 613, such that the extending direction D1 of the first microchannel 610 and the extending direction D2 of the second microchannel 611 are perpendicular to each other. In this way, the first collecting tube and the second collecting tube described below can be respectively disposed on different side surfaces of the heat exchanger 6, thereby facilitating the arrangement of the collecting tubes of the heat exchanger 6. In the embodiment, the first microchannel 610 and the second microchannel 611 are used for different refrigerant flows to flow, so that one refrigerant flow can be used for subcooling the other refrigerant flow.

Further, the plate body 613 may be a flat tube, such that a heat dissipation component or an electronic component may be disposed on the plate body 613. In other embodiments, the plate body 613 can also be a carrier with other cross-sectional shapes, such as cylinders, cuboids, cubes, and the like. In other embodiments, as described below, the heat exchange body 61 may also include at least two plate bodies 613 stacked on each other or two tubes nested on each other.

In some embodiments, in the refrigeration mode of the air conditioning system shown in FIGS. 1 to 4, the first refrigerant flow the medium pressure and medium temperature refrigerant flow) flows through the first microchannel 610, the second refrigerant flow (i.e., the low pressure and low temperature refrigerant flow) flows through the second microchannel 611, the first refrigerant flow can be the liquid phase refrigerant flow, the second refrigerant flow can be the gas-liquid two-phase refrigerant flow; and the second refrigerant flow absorbs heat from the first refrigerant flow of the first microchannel 610 during flowing along the second microchannel 611 and is further gasified, so that the first refrigerant flow is further subcooled.

The microchannel structure-based heat exchanger 6 described above and below is not limited to the application scenarios shown in FIGS. 1 to 4, thus, "first" and "second" of the first microchannel 610, the second microchannel 611, the first refrigerant flow and the second refrigerant flow are merely used to distinguish between different microchannels and refrigerant flows, it should not be construed as limiting the particular application of the microchannel 612 and refrigerant flow. In some embodiments, in other embodiments or modes of operation, the first refrigerant flow that flows through the first microchannel 610 may absorb heat from the second refrigerant flow of the second microchannel 611, and the states of the first refrigerant flow and the second refrigerant flow are not limited to liquid phase or gas-liquid two-phase as defined above.

As shown in FIGS. 1 to 4, the flowing direction A1 of the first refrigerant flow is opposite to the flowing direction A2 of the second refrigerant flow, so that a large temperature difference always exists between the temperature of the first refrigerant flow and the temperature of the second refrigerant flow in the heat exchange area, and the heat exchange efficiency of the first refrigerant flow and the second refrigerant flow is improved.

In some embodiments, the flowing direction A1 of the first refrigerant flow can be the same as or perpendicular to the flowing direction A2 of the second refrigerant flow. When the flowing directions of the refrigerants are the same, the temperature of the heat exchanger 6 on the side close to the inlet is lower, so that the heat exchange effect of the area is improved. In some embodiments, the area is connected to the area with larger electric control heating to improve the heat dissipation effect. When the flowing directions of the refrigerant are perpendicular to each other, the first collecting tube and the second collecting tube are respectively disposed on different side surfaces of the heat exchanger 6, so that the arrangement of the refrigerant collecting tubes of the heat exchanger can be facilitated.

1.1 Collecting Tube Assembly

Figure 8:
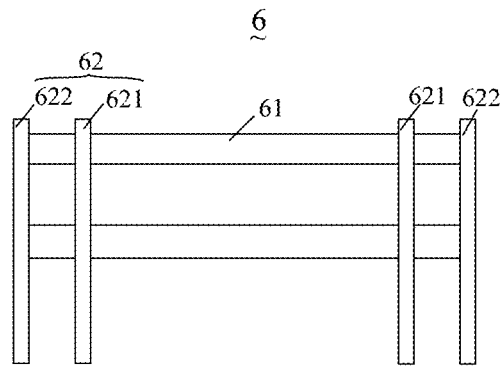
FIG. 8 is a structural schematic view of some embodiments of the heat exchange body and a collecting tube assembly of the heat exchanger of the present disclosure.

Continuing to refer to FIG. 8, the heat exchanger 6 further includes a collecting tube assembly 62. The extending direction of the collecting tube assembly 62 is perpendicular to the extending direction of the heat exchange body 61. In some embodiments, when the heat exchange body 61 is disposed along the horizontal plane, the collecting tube assembly 62 is disposed vertically in the direction of gravity, so that when the collecting tube assembly 62 is connected to the compressor 2 disposed below the heat exchanger 6, the pipeline arrangement of the collecting tube assembly 62 may be facilitated.

When the heat exchange body 61 is vertically disposed along the gravity direction, the collecting tube assembly 62 is disposed along the horizontal plane, so that the distribution uniformity of the refrigerant in the collecting tube assembly 62 can be improved, and the refrigerant in the heat exchange body 61 can be uniformly distributed.

As shown in FIG. 8, the collecting tube assembly 62 includes a first collecting tube 621 and a second collecting tube 622, the first collecting tube 621 is provided with a first collecting passage, and the second collecting tube 622 is provided with a second collecting passage. The cross-sectional shape of the heat exchanger 6 in the flowing direction of the refrigerant flow (the first refrigerant flow or the second refrigerant flow) in the heat exchange body 61 is I-shaped. In other embodiments, the cross-sectional shape of the heat exchanger 6 in the flowing direction of the refrigerant flow in the heat exchange body 61 can be L-shaped, U-shaped, G-shaped, circular, etc.

The first collecting tube is connected to the first microchannel 610, so as to provide the first refrigerant flow to the first microchannel 610 through the first collecting passage and/or collect the first refrigerant flow flowing through the first microchannel 610.

In some embodiments, in the air conditioning system shown in FIGS. 1 to 4, a first end of the first microchannel 610 is connected to the outdoor heat exchanger 4 through the expansion valve 13 and one of two first collecting tubes 621, so as to provide the first refrigerant flow to the first microchannel 610 in a refrigeration mode. The second end of the first microchannel 610 is connected to the indoor heat exchanger 5 through the other of the two first collecting tubes 621, so as to collect the first refrigerant flow flowing through the first microchannel 610. In the heating mode, since the flowing direction of the first refrigerant flow in the first microchannel 610 is opposite, the functions of the two first collecting tubes 621 are exchanged with respect to the refrigeration mode.

The second collecting passage is connected to the second microchannel 611, so as to provide the second refrigerant flow and/or collect the second refrigerant flow flowing through the second collecting, passage to the second microchannel 611. In some embodiments, in the air conditioning system shown in FIGS. 1 to 4, the first end of the second microchannel 611 is connected to the second expansion valve 12 through one of the two second collecting tubes 622, so as to provide the second refrigerant flow to the second microchannel 611. The second end of the second microchannel 611 is connected to the enthalpy-increasing inlet 221 of the compressor 2 or the inlet 81 of the gas-liquid separator 8 through the other of the two second collecting tubes 622, so as to collect the second refrigerant flow flowing through the second microchannel 611.

When the first microchannel 610 and/or the second microchannel 611 are in communication by 180° bending or reverse collecting tube to form two layers of the first microchannel 610 or the second microchannel 611. The inlet and the outlet of the first microchannel 610 and/or the second microchannel 611 may be disposed on the same side of the heat exchange body 61, and the first collecting passage and the second collecting passage may be divided into a refrigerant providing area and a refrigerant collecting area. The inlet and the outlet of the first and/or second microchannels are respectively connected to the refrigerant providing area and the refrigerant collecting area provided by the collecting tube assembly 62.

In some embodiments, the heat exchange body 61 includes at least two groups of first microchannels 610 and at least two groups of second microchannels 611. The same ends of the at least two groups of first microchannels 610 are connected to the same first collecting tube 621, and the same ends of the at least two groups of second microchannels 611 are connected to the same second collecting tube 622. That is, one collecting tube can correspond to a plurality of groups of microchannels, so that corresponding collecting tubes are prevented from being disposed on each microchannel, and the cost is reduced.

In the embodiment shown in FIG. 8, since the extending direction D1 of the first microchannel 610 and the extending direction D2 of the second microchannel 611 are parallel to each other, the extending directions of the first collecting tube 621 and the second collecting tube 622 are parallel to each other. However, in other embodiments, the extending directions of the first collecting tube 621 and the second collecting tube 622 may be adjusted in accordance with the extending directions of the first microchannel 610 and the second microchannel 611, such as, perpendicular to each other.

1.2 First Collecting Tube and Second Collecting Tube are Spaced Apart From Each Other As shown in FIG. 8, the first collecting tube 621 and the second collecting tube 622 are spaced apart from each other, and the second collecting tube 622 is further away from the heat exchange body 61 than the first collecting tube 621. The first collecting tube 621 is disposed between the second collecting tube 622 and the heat exchange body 61.

Figure 9:
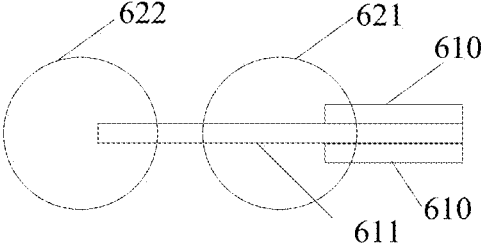
FIG. 9 is a structural schematic view of some embodiments of the heat exchanger body and the collecting tube assembly of the heat exchanger of the present disclosure.
Figure 10:
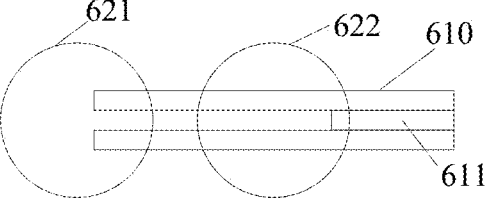
FIG. 10 is a structural schematic view of some embodiments of the heat exchange body and the collecting tube assembly of the heat exchanger of the present disclosure.

In some embodiments, as shown in FIG. 9, the second microchannel 611 is inserted into the second collecting tube 622 through the first collecting tube 621 and welded. The first microchannel 610 is inserted into the first collecting tube 621 and fixed by welding. In some embodiments, as shown in FIG. 10, the first collecting tube 621 is disposed farther away from the heat exchange body 61 than the second collecting tube 622, and the second collecting tube 622 is disposed between the first collecting tube 621 and the heat exchange body 61. The first microchannel 610 passes through the second collecting tube 622, and is inserted into the first collecting tube 621 and fixed by welding.

The microchannel passing through the collecting tube described here and in other positions of this disclosure refers to the microchannel passing through the collecting tube and not being connected to the collecting tube. The microchannel inserted into the collecting tube refers to the microchannel being connected to the collecting tube. In some embodiments, the second microchannel 611 passing through the first collecting tube 621 refers to the second microchannel 611 passing through the first collecting tube 621 and not being connected to the first collecting tube 621. The second microchannel 611 inserting into the second collecting tube 622 refers to the second microchannel 611 being connected to the second collecting tube 622.

The first microchannel 610 and the second microchannel 611 may be provided in one or more groups, respectively. In some embodiments, as shown in FIG. 9, the first microchannel 610 may be provided in two groups, the second microchannel 611 may be provided in a group, and the second microchannel 611 is located between the two groups of first microchannels 610. In other embodiments, the first microchannel 610 and the second microchannel 611 can be disposed into two or more groups, and the first microchannel 610 and the second microchannel 611 are alternately overlapped with each other. In some embodiments, the first microchannel 610—the second microchannel 611—the first microchannel 610—the second microchannel 611, or the first microchannel 610—the second microchannel 611—the second microchannel 611—the first microchannel 610, and the like are formed.

In some embodiments, as shown in FIG. 9, one of the first microchannel 610 and the second microchannel 611 may serve as a main passage. The other of the first microchannel 610 and the second microchannel 611 serves as an auxiliary passage, and the refrigerant flow in the auxiliary passage is utilized to subcool the refrigerant flow in the main passage. Because the flow rate of the refrigerant flow in the main passage is large, the flow rate of the refrigerant flow in the auxiliary passage is small, the main passage can be provided outside of the heat exchange body 61, which is easy to connect to the electric control box 7 for dissipating the heat of the electric control box 7. In addition, in this embodiment, the main passage with large refrigerant flow passes through the collecting tube corresponding to the auxiliary passage, and inserted into the collecting tube corresponding to main passage. By this way, compared with the auxiliary passage passing through the collecting tube corresponding to the main passage, does not occupy the space of the collecting tube corresponding to the main passage, the flow path pressure loss of the collecting tube corresponding to main passage can be reduced, so that the flow distribution more uniform.

In some embodiments, as shown in FIG. 10, when the first microchannel 610 is the main passage with a large refrigerant flow and the second microchannel 611 is the auxiliary passage with small refrigerant flow, the first microchannel 610 passes through the second collecting tube 622 and is inserted into the first collecting tube 621, so that the second microchannel 611 does not occupy the space of the first collecting tube 621. Compared with the mode that the second microchannel 610 passes through the first collecting tube 621, the flow path pressure loss of the first collecting tube 621 can be reduced, and the flow distribution is more uniform.

In some embodiments, the first collecting tube 621 and the second collecting tube 622 may be welded together to reduce the distance between the first collecting tube 621 and the second collecting tube 622. In other embodiments, the first collecting tube 621 and the second collecting tube 622 may be bonded or snapped together.

In addition, the first microchannel 610 may be connected to the first collecting tube 621 after bypassing the second collecting tube 622. In some embodiments, the first microchannel 610 is disposed outside of the second collecting tube 622 to be connected to the first collecting tube 621 after bypassing the second collecting tube 622, or the second microchannel 611 may be connected to the second collecting tube 622 after bypassing the first collecting tube 621.

In other embodiments, the microchannels on the heat exchange body 61 may also be provided in other ways. At least part of the microchannels passes through one of the at least two collecting tubes; and inserted into another collecting tube. By this way, the volume of the heat exchanger 6 can reduced. In specific arrangement, the microchannel with large refrigerant flow rate passes through one collecting tube of the at least two collecting tube, and inserted into another collecting tube. By this way, the pressure loss of the collecting tube can be smaller, and the flow distribution of the microchannel is more uniform.

The heat exchange body 61 may be one plate body 613, or composed of a plurality of plate bodies 613. Accordingly, the first microchannel 610 and the second microchannel 611 may be disposed in the same plate body 613, may also be provided in different plate bodies 613. In some embodiments, when the first microchannel 610 and the second microchannel 611 are disposed in the same plate body 613, one end of a part of the microchannels passes through one of the at least two collecting tubes and is inserted into the other collecting tube, and the other end of the at least part of the microchannels is inserted into the collecting tube through which the microchannel passes. Due to this arrangement, the integration level of the heat exchange body 61 can be improved, procedures such as welding and the like can be omitted, and the heat exchange effect is improved.

The at least two collecting tubes are not limited to the spacing apart from each other as described above, and may be at least two collecting tubes formed by the combination of the main collecting tube and the baffle plate as described below.

1.3 Main Collecting Tube is Divided Into Two Collecting Tubes

Figure 11:
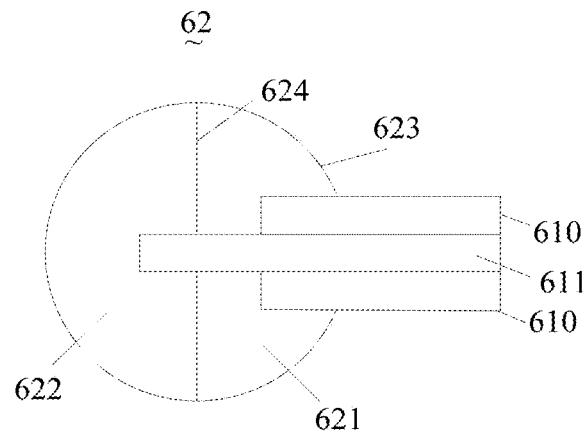
FIG. 11 is a structural schematic view of some embodiments of the heat exchange body and the collecting tube assembly of the heat exchanger of the present disclosure.

As shown in FIG. 11, the collecting tube assembly 62 includes a main collecting tube 623 and a baffle plate 624 disposed within the main collecting tube 623, so as to divide the main collecting tube 623 into a first collecting tube 621 and a second collecting tube 622 by the baffle plate 624. In other embodiments, the baffle plate 624 and the number of collecting tubes can be set according to need.

As shown in FIG. 11, the first microchannel 610 passes through the wall of the main collecting tube 623 and is inserted into the first collecting tube 621, and the second microchannel 611 passes through the tube wall of the main collecting tube 623 and the baffle plate 624 (i.e., passing through the first collecting tube 621), and into the second collecting tube 622. In other embodiments, the second microchannel 611 passes through the wall of the main collecting tube 623 and is inserted into the second collecting tube 622, and the first microchannel 610 passes through the wall of the main collecting tube 623 and the baffle plate 624 and is inserted into the first collecting tube 621.

Compared with the collecting tube assembly 62 shown in FIG. 9 or 10, the present embodiment achieves the functions of both the first collecting tube 621 and the second collecting tube 622 by one main collecting tube 623, which reduces the cost and volume of the collecting tube assembly 62.

In other embodiments, the main collecting tube 623 may be divided into two first collecting tubes 621 or two second collecting tubes 622 by the baffle plate 624. In some embodiments, when the first microchannel 610 or the second microchannel 611 form two layers of the first microchannel 610 or the second microchannel 611 by 180° bending or the reverse collecting tube, one end of the first microchannel 610 passes through the wall of the main collecting tube 623 and is inserted into one of the first collecting tubes 621, and the other end of the first microchannel 610 passes through the wall of the main collecting tube 623 and the baffle plate 624 and is inserted into the other first collecting tube 621 of the first collecting tubes 621. Or one end of the second microchannel 611 passes through the wall of the main collecting tube 623 and is inserted into one of the second collecting tubes 622, and the other end of the second microchannel 611 passes through the wall of the main collecting tube 623 and the baffle plate 624 and is inserted into the other second collecting tube 622 of the second collecting tubes 622.

Figure 12:
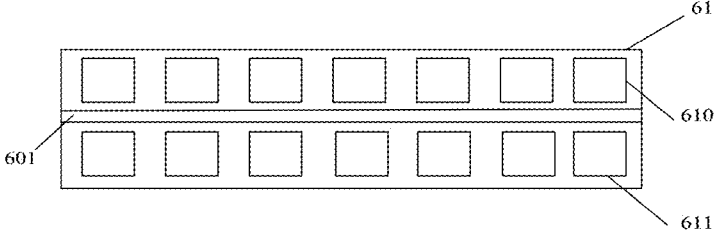
FIG. 12 is a structural schematic view of some embodiments of the heat exchange body of the heat exchanger of the present disclosure.
Figure 13:
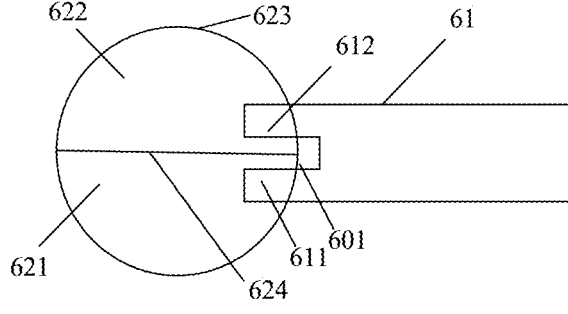
FIG. 13 is a structural schematic view of some embodiments of the heat exchange body and the collecting tube assembly of the heat exchanger of the present disclosure.

In some embodiments, as shown in FIGS. 12 and 13, a slot 601 may be provided on an end face of the heat exchange body 61. The slot 601 is located between the first microchannel 610 and the second microchannel 611, and the baffle plate 624 is embedded in the slot 601, such that the first microchannel 610 passes through the wall of the main collecting tube 623 and is inserted into the first collecting tube 621, and the second microchannel 611 passes through the wall of the main collecting tube 623 and is inserted into the second collecting tube 622. By setting the slot 601 in this way, the overall length of the heat exchanger 6 can be shortened, the material cost of the heat exchanger 6 can be reduced, and the welding process of the collecting tube assembly 62 and the heat exchange body 61 can be simplified.

In some embodiments, when the first microchannel 610 or the second microchannel 611 form two layers of the first microchannel 610 or the second microchannel 611 by 180° bending or the reverse collecting tube, the inlet end and the outlet end of the heat exchange body 61 are located on the same side. At this time, one end of the first microchannel 610 passes through the wall of the main collecting tube 623 and is inserted into one of the first collecting tubes 621, and the other end of the first microchannel 610 passes through the wall of the main collecting tube 623 and is inserted into the other one of the first collecting tubes 621.

In some embodiments, one end of the second microchannel 611 passes through the wall of the main collecting tube 623 and is inserted into one of the second collecting tubes 622, and the other end of the second microchannel 611 passes through the wall of the main collecting tube 623 and is inserted into the other of the second collecting tubes 622.

Further, the heat exchange body 61 may be a single plate body 613 or a plurality of plate bodies 613. In the embodiment shown in FIG. 12, the heat exchange body 61 may be a single plate body 613. The first microchannel 610 and the second microchannel 611 are disposed within the single plate body 613. Further, on the end face of the single plate body 613, a spacing area is disposed between the first microchannel 610 and the second microchannel 611, and the slot 601 is disposed within the spacing area. In this manner, the heat exchange body 61 is integrated and has a simple structure and high reliability, and the heat transfer efficiency of the heat exchange body 61 can be improved. In some embodiments, as described below the heat exchange body 61 may also include at least two plate bodies 613, and the at least two plate bodies 613 are stacked, the end faces of the at least two plate bodies 613 are provided with the slots 601, the slots 601 are disposed between adjacent plate bodies 613, and the baffle plate 624 is embedded in the slots 601.

The combination of the baffle plate 624 and the slot 601 described above can be adapted for other microchannel grouping modes. As long as at least two groups of microchannels are disposed on the heat exchange body 61, the at least two groups of microchannels can be connected to each other for the flow of the same refrigerant flow, or independent of each other for the flow of different refrigerant flows.

1.4 First Collecting Tube and Second Collecting Tube are Nested

Figure 14:
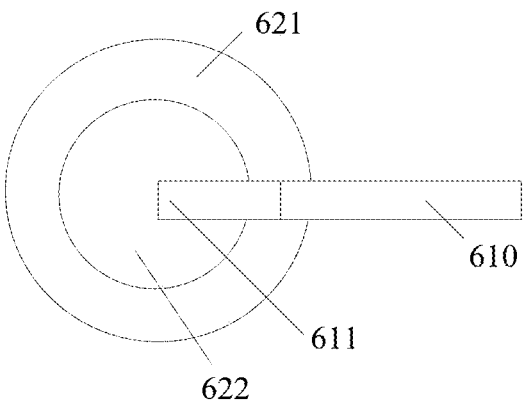
FIG. 14 is a structural schematic view of some embodiments of a heat exchange body and the collecting tube assembly of a heat exchanger of the present disclosure.

As shown in FIG. 14, the diameter of the second collecting tube 622 is smaller than the diameter of the first collecting tube 621, and the first collecting tube 621 is sleeved on the outer side of the second collecting tube 622. The first microchannel 610 passes through the wall of the first collecting tube 621 and is inserted into the first collecting tube 621. The second microchannel 611 passes through the walls of the first collecting tube 621 and the second collecting tube 622, and is inserted into the second collecting tube 622. In other embodiments, the second collecting tube 622 is sleeved on the outer side of the first collecting tube 621, at this time, the second microchannel 611 passes through the wall of the second collecting tube 622 and is inserted into the second collecting tube 622. The first microchannel 610 passes through the walls of the second collecting tube 622 and the first collecting tube 621, and is inserted into the first collecting tube 621.

Compared with the collecting tube assembly 62 shown in FIG. 9 or 10, the volume of the collecting tube assembly 62 can be reduced by nesting settings.

In other embodiments, the two first collecting tubes 621 may be nested with each other, or the two second collecting tubes 622 may be nested with each other. At this time, one end of the first microchannel 610 passes through the wall of the first collecting tube 621 on the outer side, and is inserted into the first collecting tube 621 on the outer side. The other end of the first microchannel 610 passes through the walls of the two first collecting tubes 621, and is inserted into the first collecting tube 621 on the inner side.

In some embodiments, one end of the second microchannel 611 passes through the wall of the second collecting tube 622 on the outer side, and is inserted into the second collecting tube 622 on the outer side. The other end of the second microchannel 611 passes through the walls of the two second collecting tubes 622, and is inserted into the first collecting tube 622 on the inner side.

2. Sleeved Heat Exchanger

Figure 15:
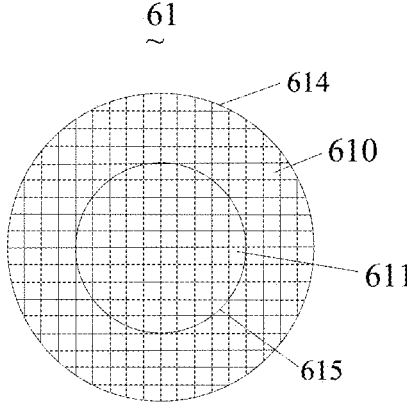
FIG. 15 is a structural schematic view of some embodiments of the heat exchange body of the heat exchanger of the present disclosure.

As shown in FIG. 15, the heat exchanger 6 includes the heat exchange body 61, and the heat exchange body 61 includes a first tube body 614 and a second tube body 615 nested with each other. That is, the heat exchanger 6 is a double-tube heat exchanger, the plurality of first microchannels 610 are disposed in the first tube body 614, the plurality of second microchannels 611 are disposed in the second tube body 615. The plurality of first microchannels 610 and the plurality of second microchannels 611 are the same as the microchannels 612 shown in FIG. 5, so that the length of the heat exchange body 61 is shortened, and the volume of the heat exchanger 6 is further reduced.

The extending direction of the first microchannel 610 and the extending direction of the second microchannel 611 are parallel to each other. In some embodiments, the extending direction of the first microchannel 610 is the same as the extending direction of the second microchannel 611.

Figure 16:
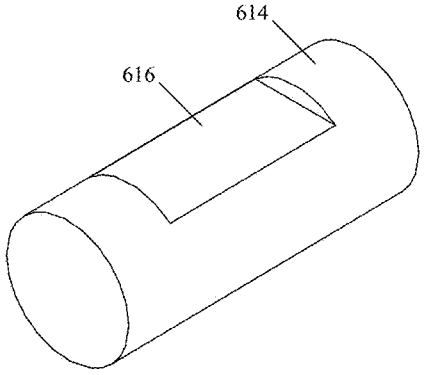
FIG. 16 is a three-dimensional structure schematic view of a first tube placement plane of FIG. 15.

In this embodiment, as shown in FIG. 16, the first tube body 614 is sleeved on the outer side of the second tube body 615, and at least one plane 616 is disposed on the outer surface of the first tube body 614 to form a heat exchange contact surface of the first tube body 614. The heat dissipation component or the electronic component can be disposed on the plane 616 to be convenient to install. In other embodiments, the second tube body 615 can be sleeved on the outer side of the first tube body 614 to form a similar plane.

In the air conditioning system 1 shown in FIGS. 1 to 4, the first refrigerant flow flows through the plurality of first microchannels 610, and the second refrigerant flow flows through the plurality of second microchannels 611. The first refrigerant flow may be a liquid phase refrigerant and the second refrigerant flow may be a gas-liquid two-phase refrigerant flow. The second refrigerant flow absorbs heat from the first refrigerant flow of the plurality of first microchannels 610 during flowing along the plurality of second microchannels 611, and is further gasified, such that the first refrigerant flow is further subcooled. In other embodiments or modes of operation, the first refrigerant flow flowing through the first microchannel 610 may absorb heat from the second refrigerant flow flowing through the second microchannel 611, and the states of the first refrigerant flow and the second refrigerant flow are not limited to liquid phase or gas-liquid phases as defined above.

Compared with the heat exchanger 6 shown in FIG. 5: the cross-sectional area of the heat exchange body 61 is enlarged, so that the pressure loss of refrigerant flow can be reduced. In addition, the first pipe body 614 and the second pipe body 615 are sleeved, so that the heat exchanging area of the first microchannels 610 and the second microchannels 611 can be increased, and the heat exchanging efficiency between the first microchannels 610 and the second microchannels 611 can be improved.

Similar to FIG. 8, the heat exchanger 6 also includes the collecting tube assembly 62, and the collecting tube assembly 62 includes the first collecting tube 621 and the second collecting tube 622. The first collecting tube 621 is provided with the first collecting passage, and the first collecting passage is configured to provide the first refrigerant flow to the first microchannel 610 and/or collect the first refrigerant flow flowing through the first microchannel 610. The second collecting tube 622 is provided with the second collecting passage, and the second collecting tube provides the second refrigerant flow to the second microchannel 611 and/or collects the second refrigerant flow flowing through the second microchannel 611. In other embodiments, the cross-sectional shape of the heat exchanger 6 along the flowing direction of the refrigerant flow in the heat exchange body 61 may be L-shaped, U-shaped, G-shaped or circular, etc.

The collecting tube assembly 62 may adopt the various collecting tube arrangements described above, such as, the setting mode that the first collecting tube 621 and the second collecting tube 622 described above are spaced apart from each other, the setting mode of the main collecting tube 623 and the baffle plate 624, or the setting mode that the first collecting tube 621 and the second collecting tube 622 may be nested with each other. At the same time, the first tube body 614 together with the first microchannel 610 thereon, and the second tube body 615 together with the second microchannel 611 thereon, may cooperate with the collecting tube in the manner described above, which will not be described further herein.

3. Heat Exchanger has a Plurality of Plate Bodies Stacked on Each Other

Figure 17:
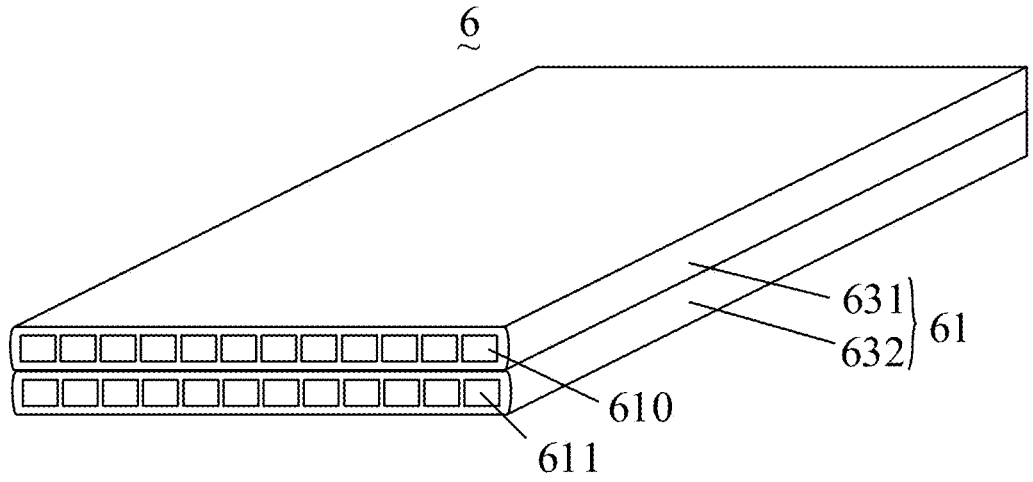
FIG. 17 is a structure schematic view of some embodiments of the heat exchange body of the heat exchanger of the present disclosure.

As shown in FIG. 17, the heat exchanger 6 includes the heat exchange body 61, and the heat exchange body 61 includes a first plate body 631 and a second plate body 632 which are stacked on each other.

The plurality of first microchannels 610 are disposed in the first plate body 631, and the plurality of second microchannels 611 are disposed in the second plate body 632. The plurality of first microchannels 610 and the plurality of second microchannels 611 are identical to the microchannels 612 shown in FIGS. 5-7, and will not be described further herein. A multi-layer structure is adopted, so that the length of the heat exchange body 61 is shortened, and the volume of the heat exchanger 6 is further reduced.

Since the first plate body 631 and the second plate body 632 are stacked on each other, the contact area between the first plate body 631 and the second plate body 632 is increased, so that the heat exchange area between the first microchannel 610 and the second microchannel 611 is increased, and the heat exchange efficiency is improved.

In the air conditioning system shown in FIGS. 1 to 4, the first refrigerant flow flows through the plurality of first microchannels 610, the second refrigerant flow flows through the plurality of second microchannels 611, and the second refrigerant flow absorbs heat from the first refrigerant flow of the plurality of first microchannels 610 during flowing along the plurality of second microchannels 611 and is further gasified, so that the first refrigerant flow is further subcooled.

In other embodiments or modes of operation, the first refrigerant flow flowing through the first microchannel 610 may absorb heat from the second refrigerant flow flowing through the second microchannel 611, and the states of the first refrigerant flow and the second refrigerant flow are not limited to liquid phase or gas-liquid phases as defined above.

The first plate body 631 and the second plate body 632 may be respectively provided with one or more. In some embodiments, the number of the first plate bodies 631 may be two, and the second plate body 632 is sandwiched between the two first plate bodies 631. In some embodiments, the first plate body 631, the second plate body 632 and the first plate body 631 are sequentially stacked. The second plate body 632 is sandwiched between the two first plate bodies 631, so that the second refrigerant flow of the second plate body 632 simultaneously absorbs heat from the first refrigerant flows of the two first plate body 631, to subcool the first refrigerant flows of the two first plate bodies 631. The heat dissipating component or the electronic component may be thermally connected to the first plate body 631, such as, disposed on a surface of the first plate body 631 away from the second plate body 632, to facilitate mounting. In other embodiments, two or more of the first plate body 631 and the second plate body 632 may be provided, and the first plate body 631 and the second plate body 632 may be alternately stacked.

In some embodiments, the two first plate bodies 631 can be two mutually independent plate bodies. In other embodiments, the two first plate bodies 631 can also be integrally connected in a U shape or connected through the reverse collecting tube. At this time, the first microchannels 610 in the two first plate bodies 631 are communicated in a U shape, so that the inlets and the outlets of the first microchannels 610 are located on the same side of the heat exchange body 61.

In other embodiments, the number of second plate bodies 632 may be two, and the first plate body 631 is sandwiched between the two second plate bodies 632. At the same time, the heat dissipation component or the electronic component may be thermally connected to the second plate body 632.

Figure 18:
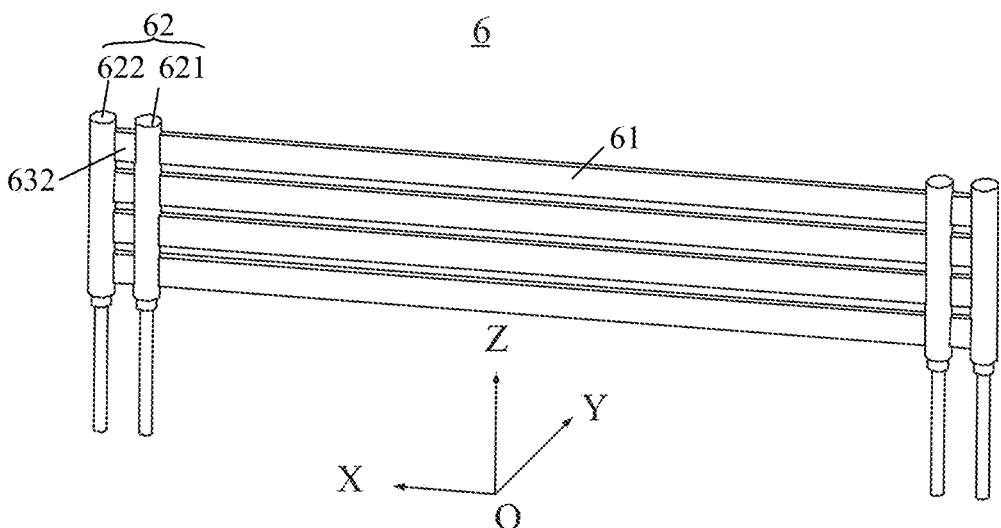
FIG. 18 is a structural schematic view of some embodiments of the heat exchange body and the collecting tube assembly of the heat exchanger of the present disclosure.

As shown in FIG. 18, The heat exchanger 6 also includes the collecting tube assembly 62, the collecting tube assembly 62 includes the first collecting tube 621 and the second collecting tube 622. The first collecting tube 621 is provided with the first collecting passage, and the first collecting tube is configured to provide the first refrigerant flow to the first microchannel 610 and/or collect the first refrigerant flow flowing through the first microchannel 610. The second collecting tube 622 is provided with the second collecting tube, and the second collecting tube 622 provides the second refrigerant flow to the second microchannel 611 and/or collects the second refrigerant flow flowing through the second microchannel 611.

The collecting tube assembly 62 may adopt the various collecting tube arrangements described above, such as, the setting mode that the first collecting tube 621 and the second collecting tube 622 described above are spaced apart from each other, the setting mode of the main collecting tube 623 and the baffle plate 624, or the setting mode that the first collecting tube 621 and the second collecting tube 622 may be nested with each other. The first plate body 631 together with the first microchannel 610 thereon, and the second plate 633 together with the second microchannel 611 thereon, may cooperate with the collecting tube in the manner described above.

3.1 Welding Process Between Stacked Plate Bodies

Figure 19:
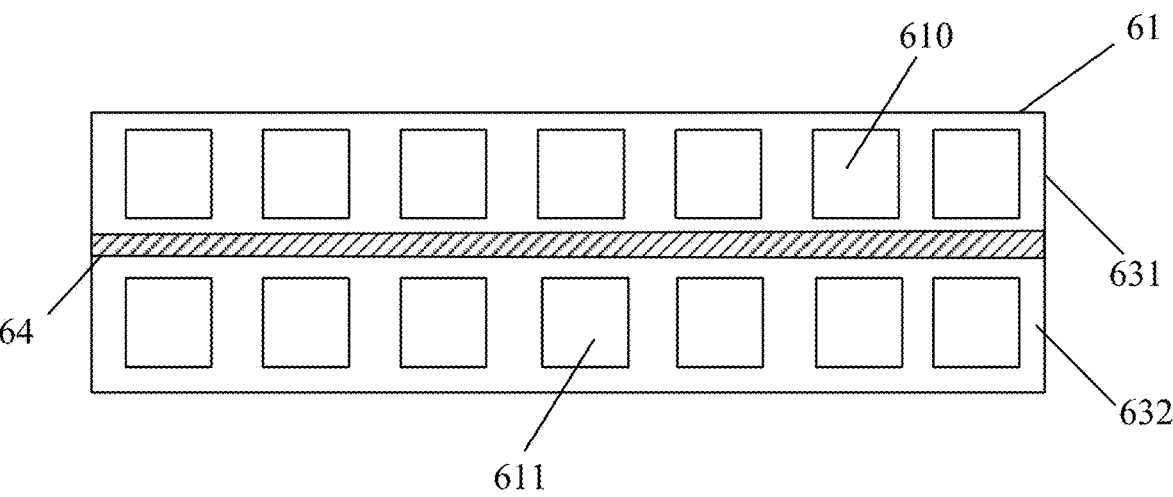
FIG. 19 is a structure schematic view of some embodiments of the heat exchange body of the heat exchanger of the present disclosure.

As shown in FIG. 19, in this embodiment, the heat exchanger 6 includes the first plate body 631, the second plate body 632 and a connecting sheet 64. The first plate body 631 and the second plate body 632 are mutually overlapped, and the connecting sheet 64 is clamped between the adjacent first plate body 631 and the adjacent second plate body 632. The solders (not shown) are disposed on two sides of the connecting sheet 64, and the solders are used for fixedly welding the connecting sheet 64 with the first plate body 631 and the second plate body 632 on two sides of the connecting sheet 64.

In this example, the solders are disposed on two sides of the connecting sheet 64, and then the first plate body 631 and the second plate body 632 are welded by the connecting sheet 64. In this manner, the first plate body 631 and the second plate body 632 can be effectively fixed. The solder is coated on the bonding surfaces of the two plate bodies 613 when the adjacent plate bodies 613 are welded, compared with the plate bodies 613 with the surfaces coated with the solder, the production cost can be greatly reduced by arranging the connecting sheet 64 with the solder between the two plate bodies 613.

Further, the connecting sheet 64 having a melting point higher than the melting point of the solder can be a metal foil, to improve thermal conductivity. In some embodiments, the connecting sheet 64 can be an aluminum foil or a copper foil or the like, which is relatively low in cost. The process of arranging the solder on two sides of the metal foil is relatively simple. Therefore, the metal foil with the solder is relatively easy to obtain and has relatively low production cost.

The coverage area of the solder on the connecting sheet 64 to the adjacent first plate body 631 and second plate body 632 on two adjacent sides shall not be less than 80% of the overlapping area of the first plate body 631 and second plate body 632, thereby improving the reliability of welding between the first plate body 631 and the second plate body 632. In some embodiments, the coverage area of the solder on the connecting sheet 64 to the first plate body 631 and the second plate body 632 may be 80% of the overlapping area of the first plate body 631 and the second plate body 632 on two adjacent sides; or, the coverage area of the solder on the connecting sheet 64 to the adjacent first plate body 631 and second plate body 632 on two adjacent sides is equal to the overlapping area of the first plate body 631 and second plate body 632, in this way, the reliability of the heat exchanger 6 may be further improved.

In some embodiments, the connecting sheet 64 between the first plate body 631 and the second plate body 632 may be of a single layer structure, that is, only one layer of connecting sheet 64 is provided between the first plate body 631 and the second plate body 632. In other embodiments, the connecting pieces 64 between the first plate body 631 and the second plate body 632 are at least two layers. In some embodiments, the connecting sheet 64 may be a two-layer, three-layer, or four-layer structure or the like. The at least two layers of connecting sheet 64 are further fixed by, solder welding. By flexibly selecting the number of layers of the connecting sheet 64, the distance between the first plate body 631 and the second plate body 632 can be adjusted, thereby enabling heat exchanger 6 to adapt to different application scenarios. In some embodiments, forming a slot between the first plate body 631 and the second plate body 632, the slot has a width equal to the laminated thickness of the at least two layers of connecting sheet 64, to cooperate with the baffle plate 624 described above.

The thickness of the connecting sheet 64 may range from 0.9 mm to 1.2 mm. In some embodiments, the thickness of the connecting sheet 64 may be 0.9 mm, mm, or 1.2 mm, etc.

The connecting sheet 64 may be disposed between other adjacent plate bodies of at least two plate bodies having microchannels, such as two first plate bodies 631, or two second plate bodies 632.

Figure 20:
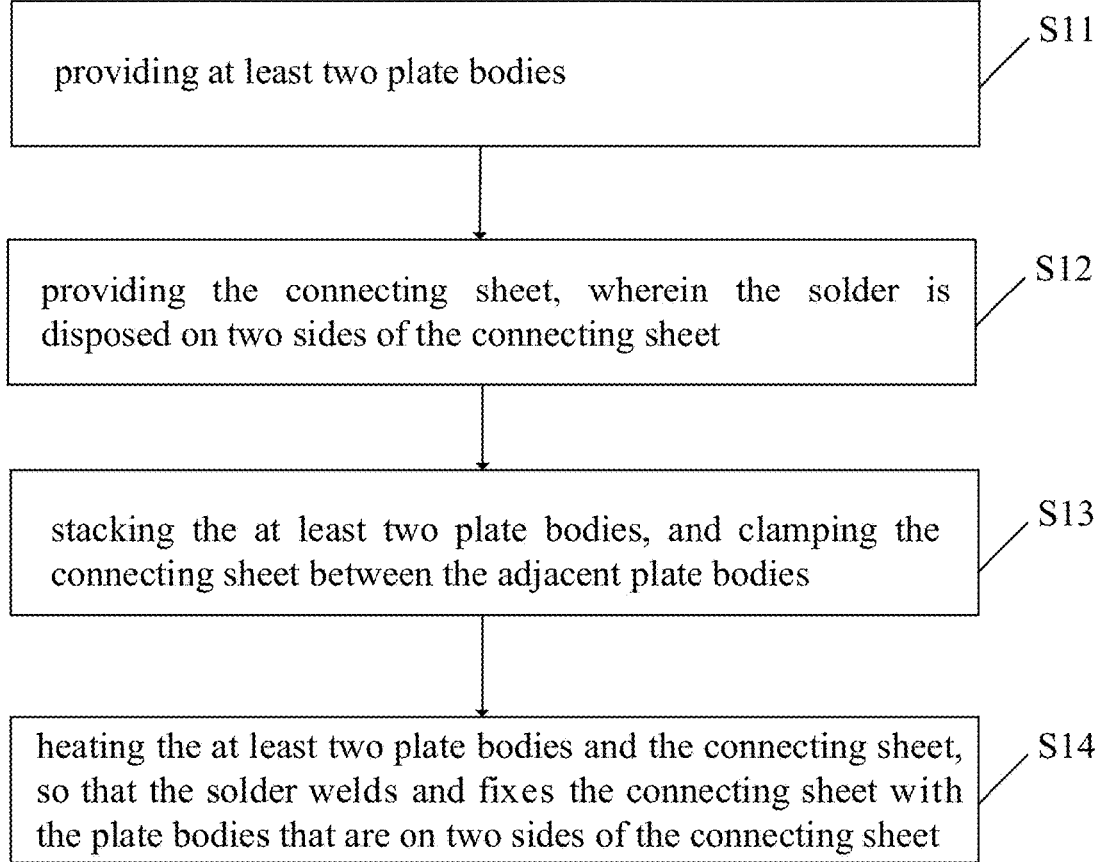
FIG. 20 is a flow view of some embodiments of a method for making the heat exchanger of FIG. 19.

In one specific embodiment, as shown in FIG. 20, the method of making the heat exchanger 6 described above may include: S11: providing at least two plate bodies; S12: providing the connecting sheet, wherein the solder is disposed on two sides of the connecting sheet S13: stacking the at least two plate bodies, and clamping the connecting sheet between the adjacent plate bodies; S14: heating the at least two plate bodies and the connecting sheet, so that the solder welds and fixes the connecting sheet with the plate bodies that are on two sides of the connecting sheet.

3.2 Connection Between Stacked Plate Body and Collecting Tube

Figure 21:
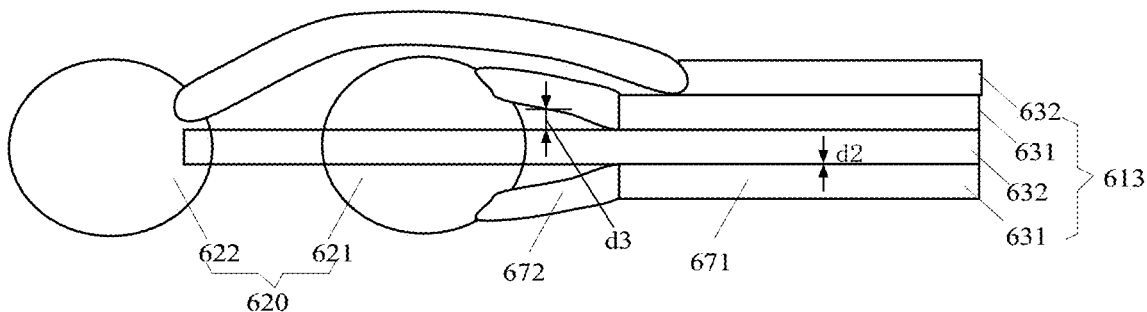
FIG. 21 is a structural schematic view of some embodiments of the heat exchange body and the collecting tube assembly of the heat exchanger of the present disclosure.

As shown in FIG. 21, the heat exchanger 6 includes at least two plate bodies 613 and at least one collecting tube 620, wherein each plate body 613 includes a body part 671 and a connecting part 672. The body parts 671 of the at least two plate bodies 613 are stacked on each other, one end of the connecting part 672 is connected to the body part 671, and the other end of the connecting part 672 is connected to the collecting tube 620.

Figure 22:
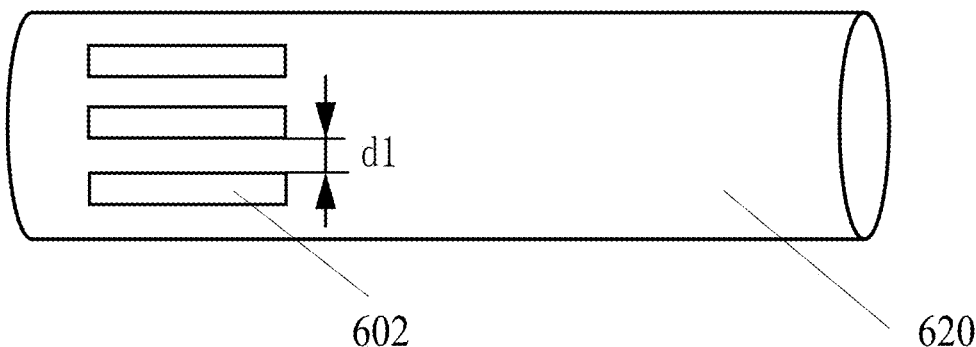
FIG. 22 is a structure schematic view of some embodiments of a collecting tube of FIG. 21.

As shown in FIG. 22, the collecting tube 620 has at least two insertion holes 602 formed in the wall of the collecting tube 620. The other end of the connecting part 672 of the plate body 613 corresponds to the insertion hole 602, and is welded and fixed on the collecting tube 620. That is, the connecting part 672 is located at the end of the plate body 613, and is configured to fix with the collecting tube 620. When the at least two plate bodies 613 are welded with the collecting tube pipe 620, if the spacing distance between the two adjacent plate bodies 613 is small at the welding position, the welding difficulty is increased, solder can flow along a gap between the two adjacent plate bodies 613, thereby causing poor welding between the plate bodies 613 and the collecting tube 620, and the risk of refrigerant flow leakage.

In this embodiment, a first spacing d1 is between two adjacent insertion holes 602 on the collecting tube 620, a second spacing d2 is between the body ports 671 of two adjacent plate bodies 613, and the first spacing d1 is greater than the second spacing d2. By this mode, the distance between the connecting parts 672 of the two adjacent plate bodies 613 at the welding position can be increased, the capillary action between the two adjacent plate bodies 613 can be reduced, and the welding reliability of the plate bodies 613 and the collecting tube 620 can be improved.

Furthermore, the first spacing d1 is not less than 2 mm, In some embodiments, the first spacing d1 can be 2 mm or 3 mm and the like, so that the capillary action between the connecting parts 672 of the plate body 613 is reduced, and the welding between the connecting parts 672 of the plate body 613 and the collecting tube 620 is facilitated. Furthermore, the first spacing d1 is not greater than 6 mm, so that the heat exchanger 6 has higher structural strength, and the reliability of the heat exchanger 6 is improved.

In some embodiments, the connecting parts 672 of at least part of the plate bodies 613 are bent, In some embodiments, the connecting parts 672 of at least part of the plate bodies 613 are disposed in an arc shape, so that the distance between the connecting parts 672 of the two adjacent plate bodies 613 can be adjusted conveniently through the bent arrangement mode, the plate bodies 613 and the collecting tube 620 can be welded and fixed conveniently, and the capillary action between the two adjacent plate bodies 613 during welding can be reduced.

In some embodiments, one end of the connecting part 672 of the plate body 613 is bent and the other end is disposed in a straight line to simplify the machining process.

Further, a third spacing d3 is formed between the connecting parts 672 of at least partially adjacent plate bodies 613. The third spacing d3 gradually increases in at least partial range from the body port 671 to the collecting tube 620, so that the distance between the adjacent connecting parts 672 gradually increases and the capillary action between two adjacent plate bodies 613 is reduced.

In the embodiment shown in FIG. 21, the at least two plate bodies 61 may include the first plate body 631 and the second plate body 632 as described above.

Further, in this embodiment, the number of the first plate bodies 631 is two, the number of the second plate bodies 632 is two, and the first plate body 631 and the second plate body 632 are stacked in the order. The second plate body 632 is sandwiched between the two first plate bodies 631, and the other second plate body 632 is overlapped on the outer side of one first plate bodies 631 that is away from the second plate body 632 sandwiched between the two first plate bodies 631. The collecting tube 620 includes the first collecting tube 621 and the second collecting tube 622 that are spaced apart from each other. The first plate body 631 is provided with a plurality of first microchannels that is configured to allow the first refrigerant flow to flow. The second plate body 632 is provided with a plurality of second microchannels that is configured to allow the second refrigerant flow to flow. The second refrigerant flow absorbs heat from the first refrigerant flow during flowing along the plurality of second microchannels 611, so that the first refrigerant flow is subcooled. Or the first refrigerant flow absorbs heat from the second refrigerant flow during flowing along the plurality of first microchannels 610, so that the second refrigerant flow is subcooled. The connecting part 672 of the first plate body 631 is fixedly welded with the first collecting tube 621, and the connecting part 672 of the second plate body 632 is fixedly welded with the second collecting tube 621.

As shown in FIG. 21, the connecting part 672 of the clamped second plate body 632 can pass through the first collecting tube 621, and is connected to the second collecting tube 622. The connecting part 672 of the second plate body 632 located on the outer side can bypass the first collecting tube 621 and be welded to the second collecting tube 622. In this way, the number of the insertion holes 602 on the first collecting tube 621 can be reduced, the distance between the insertion holes 602 is increased, and the assembly of the heat exchanger 6 is facilitated, so that the heat exchanger 6 has higher reliability, and the interference to the refrigerant flow in the first collecting tube 621 can be reduced.

In some embodiments, the connecting parts 672 of the second plate bodies 632 pass through the first collecting tube 621 and are connected to the second collecting tube 622. In other embodiments, the connecting part 672 of the first plate body 631 may pass through the second collecting tube 622 and be connected to the first collecting tube 621, which will not be described further herein.

The number of the first plate body 631 and the number of the second plate body 632 can be selected according to practical application requirements, and are not limited specifically.

The collecting tube 620 may also adopt the various collecting tube arrangements described above, and will not be described further herein.

Further, the body ports 672 of the plate body 613 have a linear structure, so that the body port 671 of the first plate body 631 and the body port 671 of the second plate body 632 can be directly welded by solder.

In other embodiments, the body port 671 of the first plate body 631 is connected to the body port 671 of the second plate body 672 through the connecting sheet 64 with the solder described above, which will not be described further herein.

4. Heat Dissipation Fins

Figure 23:
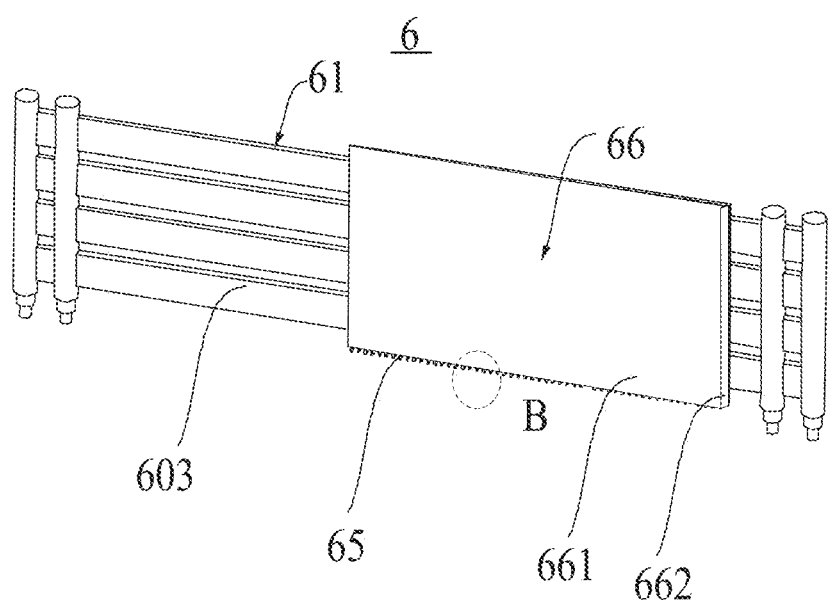
FIG. 23 is a structure schematic view of some embodiments of the heat exchanger of the present disclosure.
Figure 24:
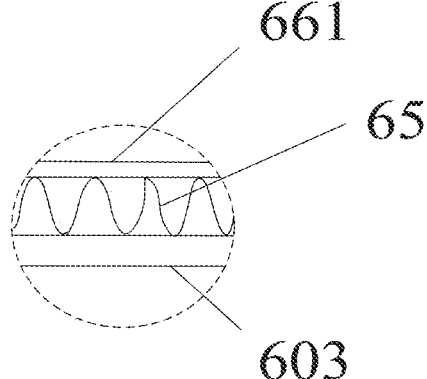
FIG. 24 is an enlarged cross-sectional structure schematic view of ring B of FIG. 23.

As shown in FIGS. 23 and 24, the heat exchanger 6 includes the heat exchange body 61 and a plurality of heat dissipation fins 65. The heat dissipation fins 65 can be disposed on the heat exchange body 61 and are in heat conduction connection with the heat exchange body 61, so that the contact area of the heat exchange body 61 and the air is enlarged by utilizing the heat dissipation fins 65, the heat exchange with the air is facilitated. The heat exchange efficiency of the heat exchanger 6 is improved, and the radiating effect of the heat exchanger 6 is improved.

The heat dissipation fins 65 can be connected to the surface of the heat exchange body 61 by welding, bonding or fastening.

Further, in the embodiment shown in FIG. 23, the heat exchange body 61 includes at least two plate body assemblies 603 juxtaposed and spaced apart from each other, and the heat dissipation fins 65 are disposed on the at least two plate body assemblies 603.

The heat exchanger 6 also includes a fixing plate 66. The fixing plate 66 simultaneously covers the heat dissipation fins 65 on the at least two plate body assemblies 603, and the fixing plate 66 is located on a side of the heat dissipation fins 65 away from the plate body assembly 603, so that a heat dissipation duct is formed. In such a manner, the sealing of the heat dissipation fins 65 adopts an integral fixing plate structure with fewer components, making the production of heat exchanger 6 simple and reliable. At the same time, the formed heat dissipation duct can improve the heat dissipation effect. The airflow direction defined by the heat dissipation duct can be set along the interval direction of the plate body component, that is, perpendicular to the extending direction of the plate body assembly 603, to increase the heat dissipation efficiency of the heat dissipation fins 65. In other embodiments, the airflow direction defined by the heat dissipation duct may be along the extending direction of the plate body assembly 603 or at other angles to the extending direction of the plate body assembly 603.

As shown in FIG. 23, the fixing plate 66 includes a top panel 661, and the top panel 661 simultaneously covers the heat dissipation fins 65 of the at least two plate body assemblies 603 to facilitate sealing of the heat dissipation fins 65.

Further, the fixing plate 66 further includes at least one side panel 662. The side panel 662 is connected to the top panel 661 in a bending mode and extends towards the plate body component 603 to seal the heat dissipation duct through the side panel 662, so that the components of the heat exchanger 6 are reduced, and the sealing performance of the heat dissipation duct is improved.

In some embodiments, in some embodiments, the fixing plate 66 may include the top panel 661 and the side panel 662. The side panel 662 is connected to one end of the top panel surface 661 in the bending mode. One end of the heat dissipation fin 65 abuts against the side panel 662 to seal the heat dissipation duct, and the other end of the heat dissipation fin 65 can be spliced and assembled through other parts, or abuts against the box body of the electric control box described below, so as to enable the heat dissipation fin 65 to form a complete air duct. In this way, the packaging of the heat dissipation fin 65 can be simplified, and the assembling efficiency can be improved.

In some embodiments, the number of the side panels 662 is two, two side panels 662 are spaced apart from each other in a direction perpendicular to the spacing direction of the at least two plate body assemblies 603. The top panel 661 is respectively connected to the two side panels 662 in the bending mode to form an accommodating space, and the heat dissipation fins 65 are located in the accommodating space, that is, between the two side panels 662. In this way, the fixing plate 66 can completely seal the heat dissipation fins 65 to form an integral heat dissipation duct, so that the number of parts is small, the packaging process of the heat dissipation fins 65 is further simplified. The production of the heat exchanger 6 is simple and reliable, and meanwhile, the heat exchange capacity is improved.

In some embodiments, as shown in FIG. 24, the heat dissipation fins 65 are wave structures formed by sheet extrusion, and the wave crests and troughs of the wave structures are respectively in contact with the surfaces of the top panel 661 and the plate body assembly 603 opposite to each other.

Figure 25:
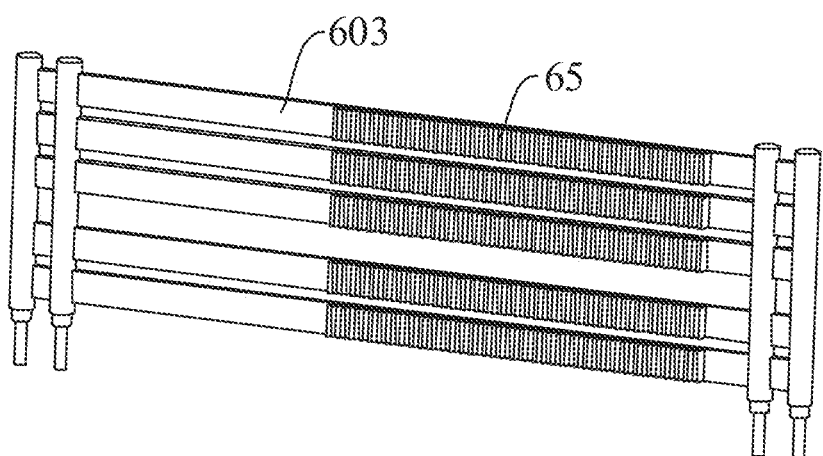
FIG. 25 is a structural schematic view of some embodiments of a heat dissipation fin of FIG. 23.

In some embodiments, the number of heat dissipation fins 65 may be at least two. As shown in FIG. 25, the number of heat dissipation fins 65 may be equal to the number of plate body assemblies 603, and each heat dissipation fin 65 is disposed on the corresponding plate body assembly 603. The width of each heat dissipation fin 65 in the vertical direction along the extending direction of the plate body assembly 603 can be equal to the width of the corresponding plate body component 603, so as to improve heat transfer capacity and save material costs.

As shown in FIG. 25, each heat dissipation fin 65 may be attached to one plate body assembly 603. A plurality of heat dissipation fins 65 may be spaced apart from each other along a spacing direction of the plate body assembly 603. In the welding process, the temperature of the gap between the plate bodies 613 is higher than that of the plate bodies 613, so that the heat dissipation fins 65 can be prevented from being melted and deformed through this setting mode. The heat dissipation fins 65 are spaced apart from each other, so that the heat exchange efficiency of the heat dissipation fins 65 can be ensured, the material can be saved, and the production cost can be reduced.

Figure 26:
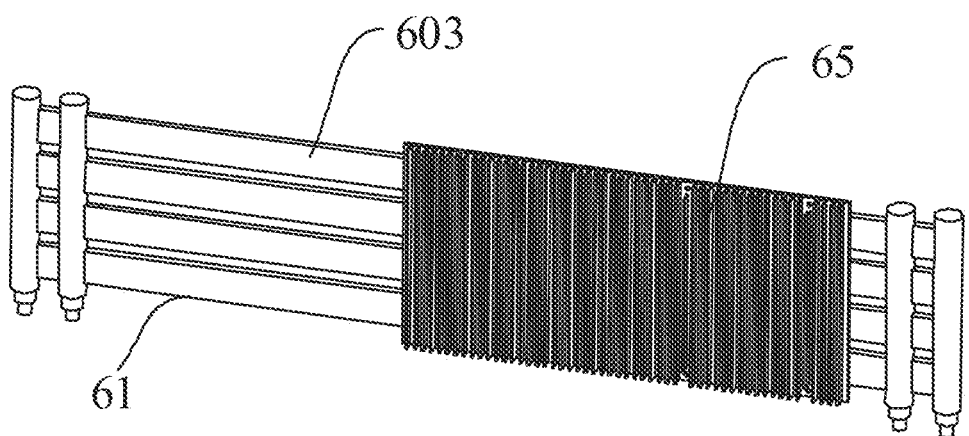
FIG. 26 is a structural schematic view of some embodiments of the heat dissipation fin of FIG. 23.

In some embodiments, as shown in FIG. 26, the number of the heat dissipation fins 65 can also be one. That is, the heat dissipation fins 65 are integrally disposed, and disposed on at least two plate body assemblies 603. At the same time, the width of the heat dissipation fins 65 in the vertical direction along the extending direction of the plate body assembly 603 can be larger than or equal to the width of the heat exchange body 61. Thus, the number of the integrated heat dissipation fins 65 is small and the surface area of the integrated heat dissipation fins 65 is large. On one hand, the heat dissipation fins 65 can be conveniently connected to the heat exchange body 61, and the mounting efficiency of the heat dissipation fins 65 and the heat exchange body 61 is improved. On the other hand, the contact area between the heat dissipation fins 65 and the air can be enlarged to enhance the heat exchange effect.

Further, the fixing plates 66 are open setting at two ends in the spacing direction of the at least two plate body assemblies 603, so that the flowing direction of the air flow in the heat dissipation duct is further disposed along the spacing direction of the at least two plate body assemblies 603. The flowing direction of the refrigerant flow in the plate body assemblies 603 is perpendicular to the spacing direction of the at least two plate body assemblies 603, so that the heat dissipation effect of the heat dissipation duct is enhanced, and the overall heat exchange efficiency of the heat exchanger 6 is improved.

Each plate body assembly 603 may be provided with the microchannel, such as, using various plate-to-microchannel configurations described above, which will not be described further herein.

As will be appreciated by those skilled in the art, the above-described heat dissipation fin 65 is applicable to the various forms of heat exchanger 6 described herein and should not be limited to a specific embodiment.

5. Heat Exchanger Serves as Heat Sink

The heat exchanger 6 described above may also be used as a heat sink (described below as heat sink 6). The heat sink 6 includes the heat exchange body 61 and the collecting tube assembly 62. The heat sink 6 is configured to dissipate heat from the electronic components within the electric control box 7. As will be appreciated by those skilled in the art, the heat sink 6 referred to herein should include the various forms of heat exchanger 6 described above, and should not be limited to a specific embodiment.

In some embodiments, the heat sink 6 is used as the economizer of the air conditioning system 1 and simultaneously replaces a module heat sink in the electric control box 7 for radiating the electric control box 7, so that the number of pipeline components and modules of the air conditioning system 1 is simplified, and the cost is lowered.

Figure 27:
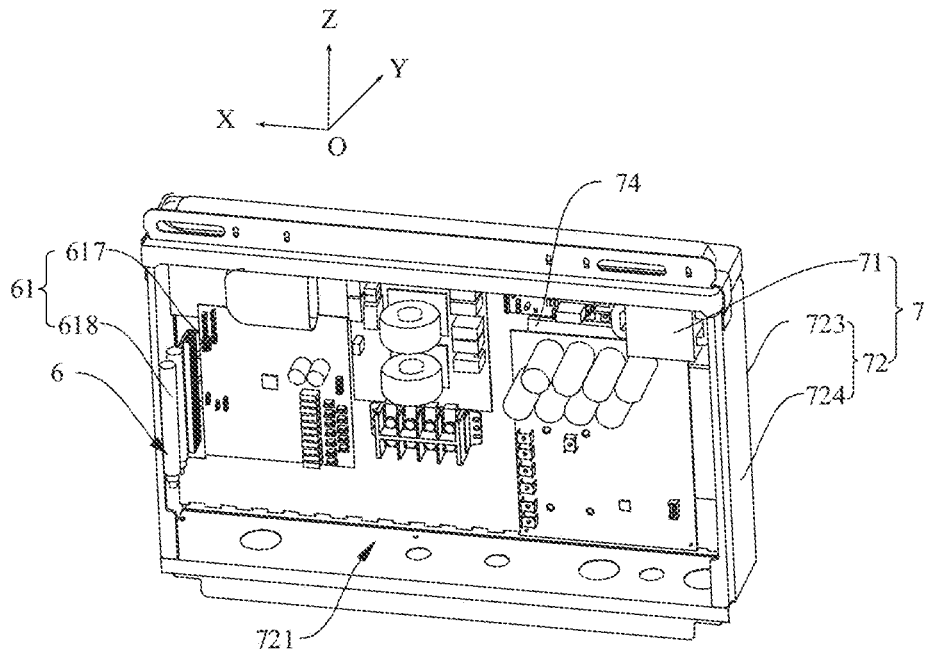
FIG. 27 is a three-dimensional structure schematic view of some embodiments of an electronic control box with a portion of the components removed of the present disclosure.

Further, as shown in FIG. 27, the electric control box 7 includes a box body 72 and the heat sink 6, the box body 72 is provided with a mounting cavity 721. An electronic component 71 is disposed in the mounting cavity 721, and the heat sink 6 is disposed in the mounting cavity 721 and is configured to dissipate the heat of the electronic component 71 in the mounting cavity 721. In some embodiments, the heat sink 6 can also be disposed outside of the box body 72 and is configured to dissipate the heat of the electronic component 71 in the mounting cavity 721.

As shown in FIG. 27, the box body 72 includes a top plate (not shown, opposite to a bottom plate 723, and covering the opening of the mounting cavity 721), the bottom plate 723 and a circumferential side plate 724. The top plate and the bottom plate 723 are opposite to and spaced apart from each other. The circumferential side plate 724 is connected to the top plate and the bottom plate 723, thereby forming the mounting cavity 721.

In some embodiments, in FIG. 27, the bottom plate 723 and the top plate are rectangular. The number of circumferential side plates 724 is four, the four circumferential side plates 724 are connected to corresponding sides of the bottom plate 723 and the top plate, respectively, further forming a cuboid electric control box 7 by enclosing the four circumferential side plates 724, the bottom plate 723 and the top plate. The length of long side of the bottom plate 723 is the length of the electric control box 7, the length of the short side of the bottom plate 723 is the width of the electric control box 7, and the height of the circumferential side plate 724 perpendicular to the bottom plate 723 is the height of the electric control box 7. As shown in FIG. 27, the length of the electric control box 7 in the X direction is the length of the electric control box 7, the length of the electric control box 7 in the Y direction is the height of the electric control box 7, and the length of the electric control box 7 in the Z direction is the width of the electric control box 7.

The specific combination of the heat sink 6 and the electronic control box 7 will be described in detail in the following examples.

5.1 Heat Exchange Body Form

In some embodiments, the heat exchange body 61 is disposed in a straight strip shape, as shown in FIG. 18, the heat exchange body 61 has an overall length, an overall width, and an overall height. The overall length is the length of the heat exchange body 61 along its extending direction; that is, the length of the heat exchange body 61 along the X direction shown in FIG. 18. The overall width is the length of the heat exchange body 61 in the direction perpendicular to the extending direction of the heat exchange body 61 and perpendicular to the plane where the heat exchange body 61 is located, that is, the length of the heat exchange body 61 along the Y direction shown in FIG. 18. The overall height is the length of the heat exchange body 61 along the Z direction shown in FIG. 18. The plane where the heat exchange body 61 is located refers to the plane where the collecting tube assembly 62 is located, which is the XOZ plane shown in FIG. 18.

In this embodiment, as shown in FIG. 27, the heat exchange body 61 may be disposed on the bottom plate 723 of the electric control box 7 or may be disposed on the circumferential side plate 724 of the electric control box 7. In other embodiments, the heat exchange body 61 may also be fixed on other positions of the electric control box 7 according to the setting position of the electronic component 71. The embodiments of the present disclosure are not specifically limited.

When the heat exchange body 61 is in the shape of the straight strip as shown in FIG. 18, the heat exchange body 61 may be abutted against the bottom plate 723, or the heat exchange body 61 and the bottom plate 723 are spaced apart from each other, so that the size of the bottom plate 723 in the length direction can be full utilized. The heat exchange body 61 as long as possible is disposed to improve the heat exchange effect. In other embodiments, the heat exchange body 61 can also be abutted against the circumferential side plate 724, or the heat exchange body 61 and the circumferential side plate 724 are spaced apart from each other, and the embodiment of the present disclosure is not specifically limited.

Figure 28:
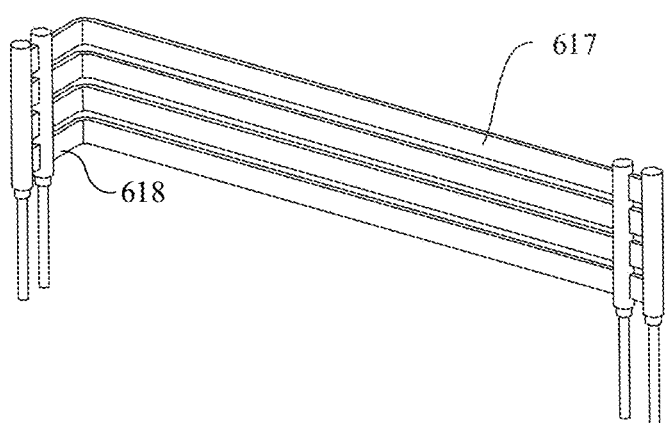
FIG. 28 is a three-dimensional structure schematic view of some embodiments of a heat sink of FIG. 27.

Further, referring to FIG. 28, in order to reduce the overall length of the heat exchange body 61, the heat exchange body 61 may be divided into a first extension part 617 and a second extension part 618. The second extension part 618 is connected to the end of the first extension part 617 and bent toward one side of the first extension part 617, so that the heat exchange body 61 is L-shaped.

By bending the heat exchange body 61 to form the first extension part 617 and the second extension part 618 that are connected in a bending way, the overall length of the heat exchange body 61 can be reduced under the condition of ensuring that the heat exchange body 61 has enough extension length, so that the length of the electric control box 7 matched with the heat sink 6 along the X direction can be reduced, and the volume of the electric control box 7 can be reduced.

In some embodiments, the first extension part 617 may be disposed parallel to the bottom plate 723 to fully utilize the size of the length direction of the bottom plate 723, and the heat exchange body 61 may be disposed as long as possible to enhance the heat exchange effect. The second extension part 618 may be disposed parallel to the circumferential side plate 724 to reduce the space occupied by the second extension part 618 in the x-direction.

In some embodiments, the first extension part 617 may be parallel to one of the circumferential side plates 724, and the second extension part 618 may be parallel to one circumferential side plate 724 adjacent to the circumferential side plate 724, to dispose the heat sink 6 on one of the sides of the mounting cavity 721.

In some embodiments, the first extension part 617 may be abutted against the bottom plate 723, or may be spaced apart from the bottom plate 723. The second extension part 618 may be abutted against the circumferential side plate 724, or may be spaced apart from the circumferential side plate 724, and the embodiments of the present disclosure are not specifically limited.

Further, as shown in FIG. 28, the number of second extension part 618 may be one, and the second extension part 618 is attached to one end of the first extension part 617 such that the heat exchange body 61 is L-shaped.

Figure 29:
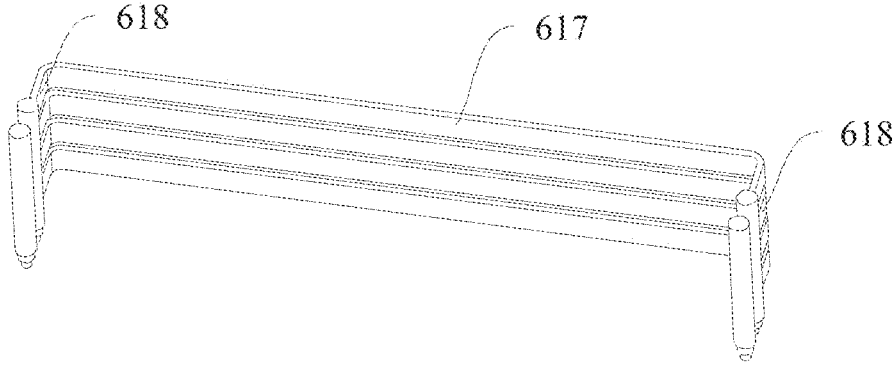
FIG. 29 is a three-dimensional structure schematic view of some embodiments of the heat sink of FIG. 27.

As shown in FIG. 29, the number of second extension part 618 may be two. The two second extension parts 618 are respectively connected to two opposite ends of the first extension parts 617, and respectively bent toward the same side of the first extension part 617.

In some embodiments, two second extension parts 618 may be spaced apart from each other and parallel at two opposite ends of the first extension parts 617, thereby reducing the overall length of heat exchange body 61 and the volume of heat sink 6 while ensuring the heat exchange effect of heat exchange body 61. In addition, compared with the two second extension parts 618 respectively located on two opposite sides of the first extension part 617, the two second extension parts 618 are located on the same side of the first extension part 617 in a bending mode, so that the overall width of the heat sink 6 can be conveniently shortened.

Furthermore, the two second extending parts 618 can be perpendicularly to the first extending parts 617 to form the U-shaped heat exchange body 61, so that not only can the overall length of the heat exchange body 61 be reduced, but also the occupied space of the second extending parts 618 in the X direction can be reduced, and the interference between the two second extending parts 618 and the electronic component 71 in the mounting cavity 721 can be avoided.

In some embodiments, the two second extension parts 618 may be tilted with respect to the first extension part 617. The angles of inclination of the two second extension parts 618 with respect to the first extension part 617 may be the same or different to reduce the overall width of the electronic control box 7.

Further, the extending length of the first extension part 617 is larger than that of the second extension part 618, so that the first extension part 617 is disposed along the length direction of the electric control box 7, and the second extension part 618 is disposed along the width or height direction of the electric control box 7.

Further, as shown in FIG. 27, the number of heat sinks 6 disposed in the mounting cavity 721 may be one, one heat sink 6 may located in the mounting cavity 721 and extend along the length direction of the box body 72, or one heat sink 6 may located in the mounting cavity 721 and extend along the height direction of the box body 72.

In some embodiments, the number of the heat sinks 6 disposed in the mounting cavity 721 can be at least two. In some embodiments, the number of the heat sinks 6 can be two, three, four or five, and the heat dissipation effect of the electric control box 7 can be improved by arranging a large number of the heat sinks 6.

5.2 Heat Sink is Disposed Inside of Electric Control Box

As will be appreciated by those skilled in the art, the various forms of heat sink 6 disclosed herein may also be disposed within the mounting cavity 721 of the electric control box 7 or applied to the heat dissipation of the electric control box 7, and may be thermally connected to the electronic component 71 in a direct or indirect manner.

Further, as shown in FIG. 27, the heat sink 6 is disposed in the mounting cavity 721 of the electronic control box 7. In some embodiments, the heat sink 6 may be thermally connected to the electronic component 71 disposed in the mounting cavity 721 for heat dissipation of the electronic component 71.

In some embodiments, the electronic component 71 can be thermally connected to the heat exchange body 61, and can be thermally connected to any position of the heat exchange body 61.

When the heat exchange body 61 in the heat sink 6 is in the straight strip shape (i.e., when the heat sink 6 is I-shaped), the electronic component 71 can be disposed at any position on the heat exchange body 61. In this manner, the assembly of electronic components 71 is facilitated. In some embodiments, the electronic component 71 can be disposed in the middle position of the heat exchange body 61, or can be disposed at two ends of the heat exchange body 61. The electronic component 71 can be disposed on one side of the heat exchange body 61, or can be disposed on two opposite sides of the heat exchange body 61 according to practical application scenarios.

In the embodiment shown in FIGS. 28 and 29, when the heat sink 6 is L-shaped or U-shaped, the electronic component 71 may be thermally connected to the first extension part 617, and the electronic component 71 and the second extension part 618 may be disposed on the same side of the first extension part 617 to reduce the height of the electric control box 7, that is, the dimension in the Y direction.

In some embodiments, the electronic component 71 may be thermally connected to the second extension part 618, and In some embodiments, the electronic component 71 may be disposed on the side of the second extension part 618 facing the first extension part 617 to shorten the length of the electric control box 7, that is, the dimension in the X direction.

In some embodiments, the electronic component 71 may be partially disposed on the first extension part 617 and partially disposed on the second extension part 618, such that the electronic component 71 is uniformly distributed.

Figure 30:
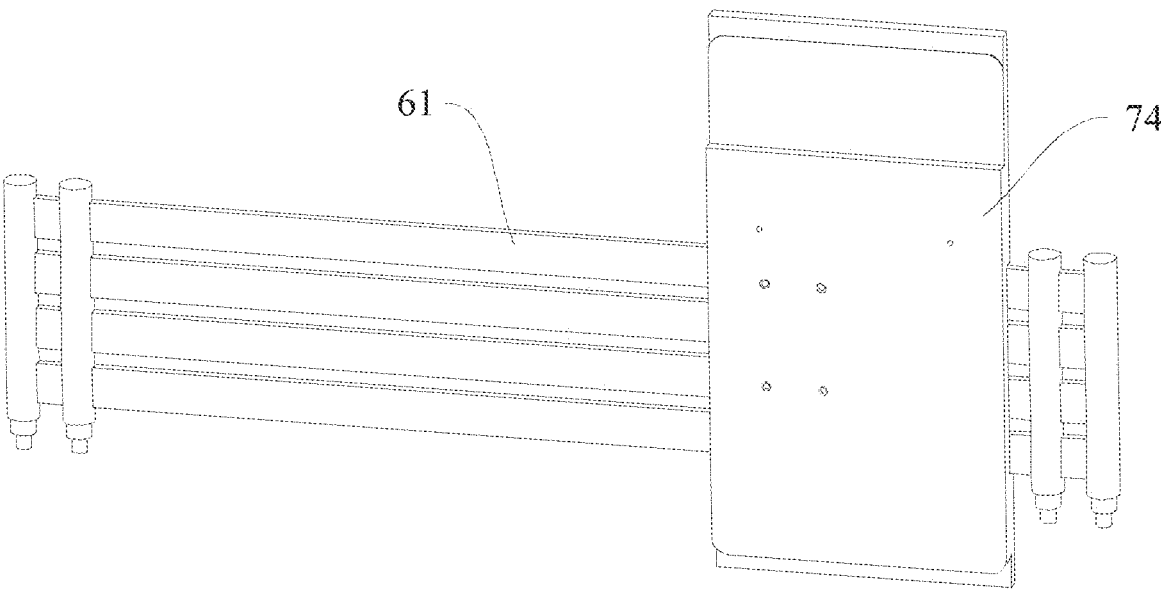
FIG. 30 is a three-dimensional structure schematic view of some embodiments of a heat dissipation fixing plate and the heat sink of the present disclosure.

As shown in FIGS. 27 and 30, a heat dissipation fixing plate 74 can also be disposed in the electric control box 7. The electronic component 71 is disposed on the heat dissipation fixing plate 74, and then the heat dissipation fixing plate 74 is connected to the heat exchange body 61, so that the electronic component 71 and the heat exchange body 61 are in heat conduction connection through the heat dissipation fixing plate 74. Therefore, the mounting efficiency of the electronic component 71 can be greatly improved.

The heat dissipation fixing plate 74 can be made of a metal plate or an alloy plate with good heat conduction performance. In some embodiments, the heat dissipation fixing plate 74 can be made of an aluminum plate, a copper plate, an aluminum alloy plate and the like to improve the heat conduction efficiency.

Figure 31:
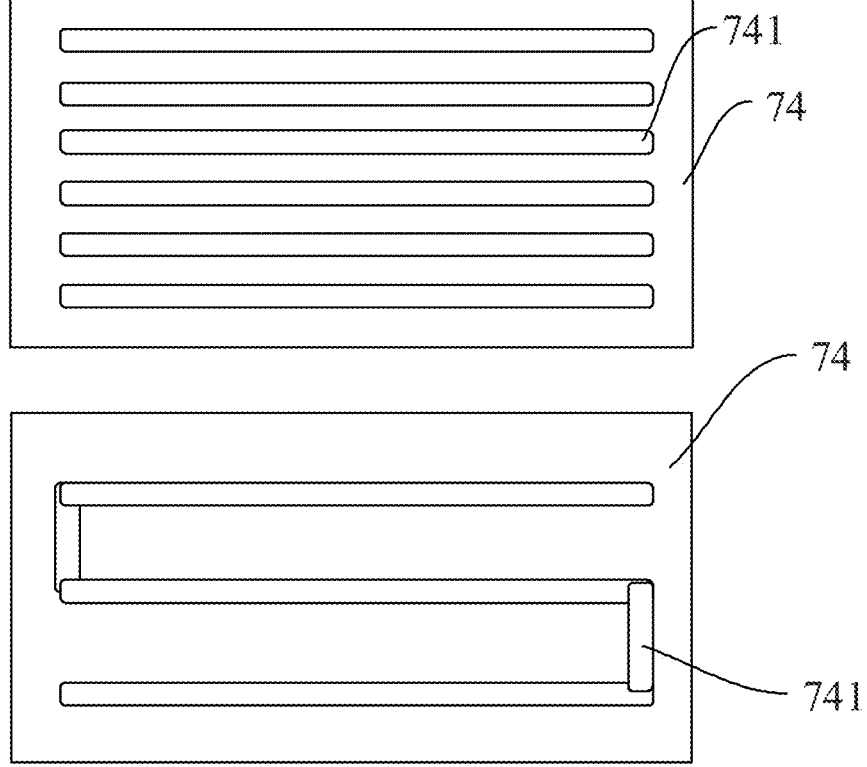
FIG. 31 is a plane structure schematic view of some embodiments of the heat dissipation fixing plate of FIG. 30.

In some embodiments, as shown in FIG. 31, a heat pipe 741 can be embedded in the heat dissipation fixing plate 74. The heat pipe 741 is configured to rapidly conduct and diffuse the concentrated high-density heat source to the surface of the whole heat dissipation fixing plate 74, so that the heat on the heat dissipation fixing plate 74 is uniformly distributed, and the heat exchange effect of the heat dissipation fixing plate 74 and the heat exchange body 61 is enhanced.

As shown in the figure on the upper side of FIG. 31, the heat pipes 741 can be a long strip shape, the number of the heat pipes 741 can be multiple, the heat pipes 741 can be parallel to and spaced apart from each other. In some embodiments, as shown in the figure on the lower side of FIG. 31 the heat pipes 741 can be sequentially connected to form an annular shape or a frame shape. The embodiment of the present disclosure is not specifically limited.

5.3 Heat Sink is Disposed Outside of Electric Control Box

Figure 32:
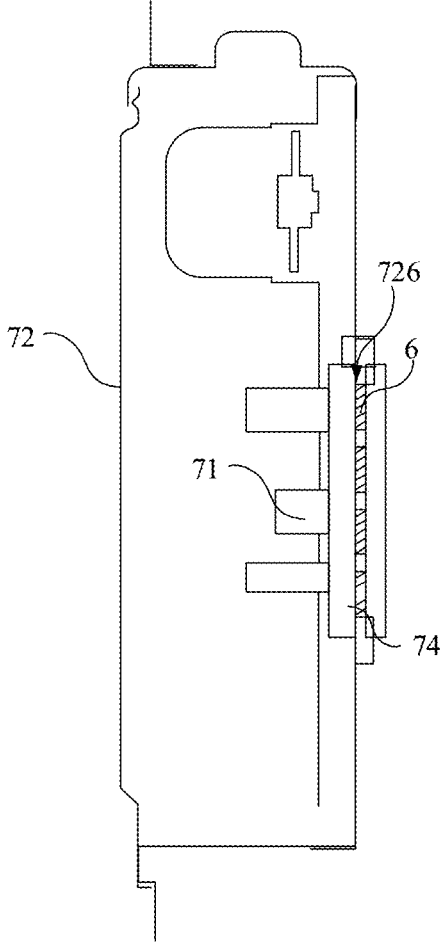
FIG. 32 is a cross-sectional structure schematic view of some embodiments of the heat sink and the electronic control box of the present disclosure.

As shown in FIG. 32, the heat sink 6 is disposed outside of the electric control box 7, an assembly port 726 can be disposed on the box body 72 of the electric control box 7, and the electronic component 71 is thermally connected to the heat sink 6 through the assembly port 726.

In some embodiments, as shown in FIG. 32, the electronic component 71 is disposed on a side surface of the heat sink fixing plate 74 away from the heat sink 6.

Figure 33:
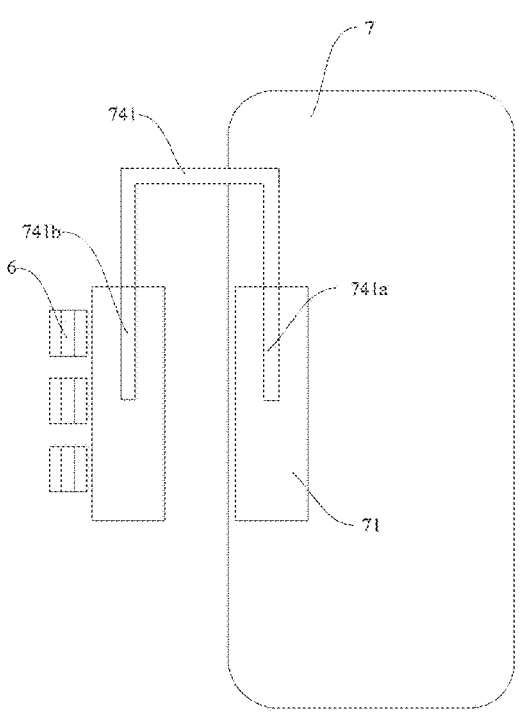
FIG. 33 is a cross-sectional structure schematic view of some embodiments of the heat sink and the electronic control box of the present disclosure.

In some embodiments, as shown in FIG. 33, the heat pipes 741 may be provided, so that the electronic component 71 is thermally connected to the heat sink 6. In some embodiments, the heat pipe 741 may include a heat absorbing end 741*a* and a heat releasing end 741*b*. The heat absorbing end 741*a* of the heat pipe 741 may be inserted into the interior of the mounting cavity 721 and thermally connected to the electronic component 71, for absorbing heat from the electronic component 71. The heat releasing end 741*b* of the heat pipe 741 may be disposed outside of the electric control box 7 and thermally connected to the heat sink 6, for dissipating heat from the heat releasing end 741*b* of the heat pipe 741 through the heat sink 6.

5.4 Arrangements of Heat Dissipation Fins and Electronic Component

In the embodiment shown in FIGS. 23-26, the heat sink 6 includes the heat dissipation fins 65. When the heat sink 6 with the heat dissipation fins 65 is applied to the electric control box 7, the contact area of the heat exchange body 61 and the air in the electric control box 7 can be enlarged by utilizing the heat dissipation fins 65, so that the heat exchange with the air is facilitated, the temperature in the mounting cavity 721 is reduced, and the electronic component 71 is protected.

In some embodiments, the electronic component 71 and the heat dissipation fins 65 may be disposed on the same side of the heat exchange body 6, and the electronic component 71 and the heat dissipation fins 65 are disposed in a staggered manner, so that interference between the electronic component 71 and the heat dissipation fins 65 is avoided. The distance between the electronic component 71 and the heat dissipation fins 65 is larger, so that the temperature of the refrigerant contacted with the heat dissipation fins 65 and the electronic component 71 is lower, and the dissipating effect of the heat exchange body 61 is improved.

In other embodiments, the electronic component 71 is disposed on one side of the heat exchange body 61, and the heat dissipation fins 65 are disposed on the other side of the heat exchange body 61. In some embodiments, the heat dissipation fins 65 may be disposed at any position on the other side of the heat exchange body 61.

In some embodiments, the heat dissipation fins 65 may extend to the outside of the electric control box 7. In some embodiments, the box body 72 is provided with the assembly port 726, the heat exchange body 61 is disposed in the box body 72 and thermally connected to the electronic component 71. One side of the heat dissipation fin 65 is thermally connected to the heat exchange body 61 and extends to the outer side of the box body 72 through the assembly port 726. The dissipating heat capacity of the heat exchange body 61 can be further improved through air cooling assistance.

6. Electronic Component is Disposed at a Position Where Temperature of Heat Sink is Higher Referring to FIG. 34, the electronic control box 7 of the present embodiment includes the box body 72 provided with the mounting cavity 721 the heat sink 6 at least partially disposed in the mounting cavity 721, and the electronic component 71 disposed in the mounting cavity 721. The structures of the box body 72 and the heat sink 6 are substantially identical to those of the embodiments described above, reference is made to the description of the embodiments described above.

In some embodiments, the heat exchange body 61 may be disposed entirely in the mounting cavity 721 of the electric control box 7, or may be partially disposed in the mounting cavity 721 of the electric control box 7, partially protruding beyond the electric control box 7 for connection with the collecting tube assembly 62 and an external pipeline.

The flowing of the refrigerant flow causes the temperature of the heat sink 6 to be lower. Because the electronic component 71 in the electric control box 7 generates heat to cause the temperature in the mounting cavity 721 of the electric control box 7 to be higher, when the air with higher temperature in the electric control box 7 is contacted with the heat sink 6, the air is easy to condense, so that the condensed water is formed on the surface of the heat sink 6. When the generated condensed water flows to the position where the electronic component 71 is located, the electronic component 71 is easy to short circuit or damage, and more serious fire hazards can be generated.

Figure 34:
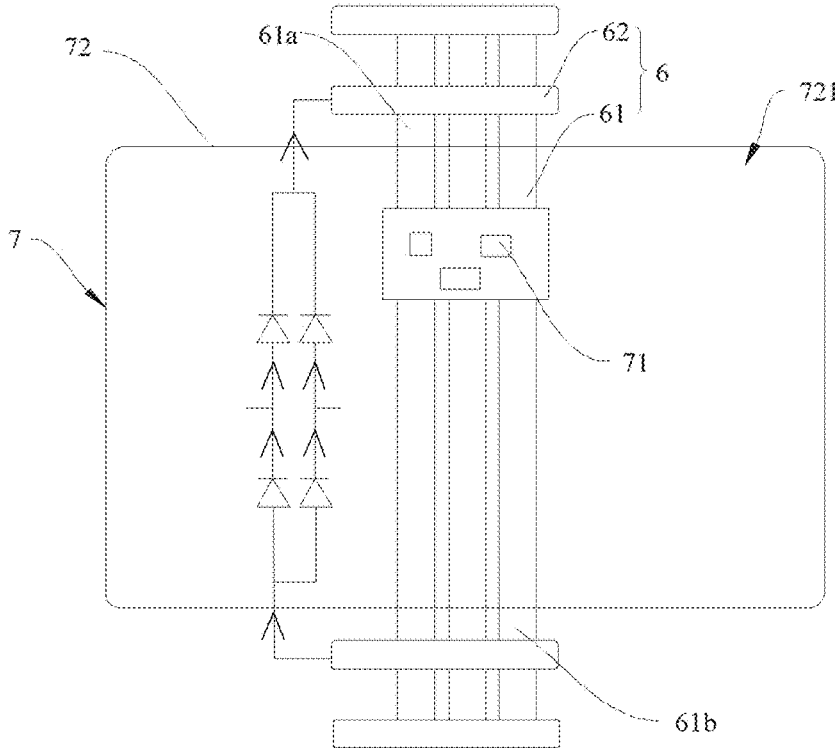
FIG. 34 is a plane structure schematic view of some embodiments of a coordination between the heat sink and the electronic control box of the present disclosure.

Thus, as shown in FIG. 34, the heat exchange body 61 may be divided into a first end 6A and a second end 61b along the flowing direction of the refrigerant flow. When the heat exchange body 61 operates, the temperature of the heat exchange body 61 is gradually reduced in the direction from the first end 6A to the second end 61b. That is, the temperature of the first end 6A is higher than the temperature of the second end 61b. The electronic component 71 is disposed at a position close to the first end 61a, and the electronic component 71 is thermally connected to the heat exchange body 61. Since the heat exchange body 61 exchanges heat with the internal environment of the electric control box 7 or the internal components thereof, the temperature of the heat exchange body 61 described above and below refers to the surface temperature of the heat exchange body 61. In some embodiments, the change of the surface temperature of the heat exchange body 61 is determined by the heat exchange passage adjacent to the surface. In some embodiments, when the heat exchange passage adjacent to the surface of the heat exchange body 61 is the main passage, because the refrigerant flow of the main passage is continuously absorbed by the refrigerant flow of the auxiliary passage, the surface temperature of the heat exchange body 61 gradually decreases along the refrigerant flow direction of the main passage. At this time, the refrigerant flow direction of the first end 61a along the main passage flows to the upstream located on the second end 61b. When the heat exchange passage adjacent to the surface of the heat exchange body 61 is the auxiliary passage, the surface temperature of the heat exchange body 61 gradually decreases and increases along the refrigerant flow direction of the auxiliary passage. At this time, the first end 61a flows to the downstream located on the second end 61b along the refrigerant flow direction of the auxiliary passage.

Therefore, according to the temperature change of the heat exchange body 61 during operation, the heat exchange body 61 is divided into the first end 6A with higher temperature and the second end 61b with lower temperature. Because the temperature difference between the first end 61a with higher temperature and the hot air is smaller, the condensed water cannot be generated or the amount of the generated condensed water is smaller. By disposing the electronic component 71 at the position close to the first end 61a, the contact probability of the electronic component 71 and the condensed water can be reduced, and the electronic component 71 is further protected.

Since the air conditioner generally has a refrigeration mode and a heating mode, and in these two modes, there may be a case where the refrigerant flows in opposite directions. The temperature of the heat exchange body 61 has an opposite change tendency from the first end 6A to the second end 61b. That is, in one mode, the temperature of the heat exchange body 61 gradually decreases from the first end 61a to the second end 61b, and in another mode, the temperature of the heat exchange body 61 gradually increases from the first end 61a to the second end 61b. In this embodiment, it is preferable to ensure that in the refrigeration mode, the temperature of the heat exchange body 61 gradually decreases from the first end 61a to the second end 61b, for the following reasons.

When the ambient temperature is low, In some embodiments, when the air conditioner operates in winter to heat, the temperature of the air in the electric control box 7 is lower. At this time, the temperature difference between the air in the electric control box 7 and the heat sink 6 is small, air is not easy to condense to form the condensed water. When the ambient, temperature is high, In some embodiments, when the air conditioner operates in summer for refrigeration, the temperature of the air in the electric control box 7 is higher. Since the temperature difference between the air in the electric control box 7 and the heat sink 6 is large, the air is easy to condense to form the condensed water. In this embodiment, at least in the refrigeration mode of the air conditioner, the temperature of the heat exchange body 61 is gradually reduced in the direction from the first end 61a to the second end 61b, so as to prevent the heat sink 6 from generating the condensed water in the refrigeration mode.

Further, disposing the electronic component 71 at the position close to the first end 61a, means that the electronic component 71 has a first distance between the thermal conductivity connection position on the heat exchange body 61 and the first end 61a, and a second distance between the thermal conductivity connection position on the heat exchange body 61 and the second end 61b. The first distance is less than the second distance.

In some embodiments, since the temperature of the heat exchange body 61 gradually decreases in the direction from the first end 6a to the second end 61b, the temperature of the first end 6a is the highest, and the temperature of the second end 61b is the lowest. The higher the temperature of the heat exchange body 61, the smaller the temperature difference between the heat sink 6 and the air in the electric control box 7, the more difficult the condensed water is to condense. The lower the temperature of the heat exchange body 61 is, the larger the temperature difference between the heat sink 6 and the hot air is, the easier the condensed water is condensed. In the direction from the first end 61a to the second end 61b of the heat exchange body 61, the probability of generating condensed water is gradually increased. Thus, the risk of contact between the electronic component 71 and the condensed water can be reduced by disposing the electronic component 71 close to the higher temperature end of the heat exchange body 61, that is, at the position where the condensed water is not easy to accumulate, thereby protecting the electronic component 71.

Further, as shown in FIG. 34, the extending direction of the heat exchange body 61 can be disposed along the vertical direction, and the first end 61a is disposed above the second end 61b, so that when the condensed water is generated at the position of the heat exchange body 61 closed to the second end 61b, the condensed water can flow downwards along the vertical direction. That is, the condensed water can flow towards the direction away from the electronic component 71, and the electronic component 71 is prevented from being contacted with the condensed water.

In some embodiments, the extending direction of the heat exchange body 61 can be disposed along the horizontal direction as required, so that the condensed water generated at the position close to the second end 61b can be quickly separated from the heat exchange body 61 under the action of gravity, thereby avoiding contacting with the electronic component 71. In some embodiments, in other embodiments, the extending direction of the heat exchange body 61 may be tilted with respect to the horizontal direction, and embodiments of the present disclosure are not specifically limited.

The structure of the heat sink 6 in this embodiment may be the same as in the embodiments described above, that is, a bent heat exchange body 61 is adopted. Or the structure of the heat sink 6 in the present embodiment can also adopt a straight strip-shaped heat exchange body 61. Or beside the heat sink 6 with microchannels described above, other types of heat sinks may also be adopted. The embodiments of the present disclosure do not limit the specific structure of the heat sink 6. In addition, other embodiments of the present disclosure that apply the heat sink to the electronic control box may adopt the various heat sinks disclosed herein, or other heat sinks well known in the art.

7. Prevention of Condensed Water

Figure 35:
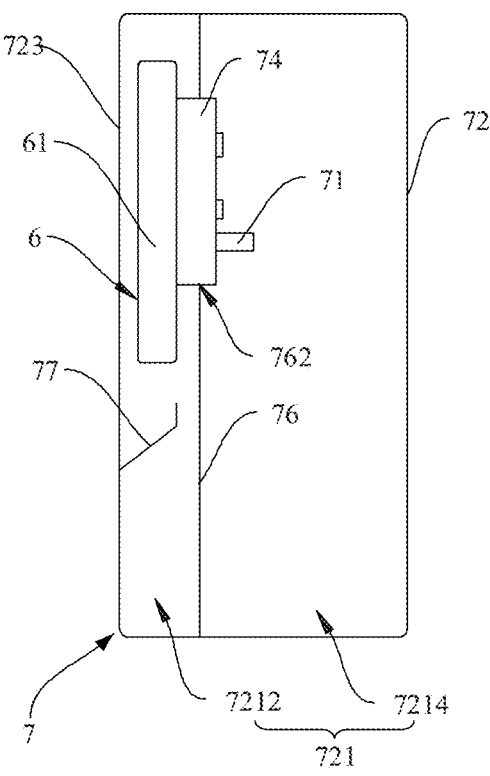
FIG. 35 is a cross-sectional structure schematic view of some embodiments of the coordination between the heat sink and the electronic control box of the present disclosure.

Referring to FIG. 35, the electric control box 7 of the present embodiment includes the box body 72, a mounting plate 76, the electronic component 71, and the heat sink 6.

The box body 72 is provided with the mounting cavity 721, the mounting plate 76 is disposed in the mounting cavity 721 so that the mounting cavity 721 forms a first cavity 7212 and a second cavity 7214 on two sides of the mounting plate 76. The electronic component 71 is disposed in the second cavity 7214, at least a portion of the heat exchange body 61 is disposed in the first cavity 7212 and is thermally connected to the electronic component 71, and the mounting plate 76 is configured to block the condensed water on the heat sink 6 from flowing into the second cavity 7214.

By disposing the mounting plate 76 used for dividing the mounting cavity 721 in the electric control box 7 and respectively disposing the heat exchange body 61 and the electronic component 71 in the first cavity 7212 and the second cavity 7214 which are independent of each other, the electronic component 71 can be completely isolated from the condensed water, so that short circuit or damage of the electronic component 71 caused by contacting with the condensed water can be avoided.

Further, a heat dissipation fixing plate 74 may be configured to indirectly connect the electronic component 71 to the heat exchange body 61.

In some embodiments, an avoiding hole 762 may be formed in the mounting plate 76 at a position corresponding to the heat dissipation fixing plate 74. The heat dissipation fixing plate 74 is connected to the heat exchange body 61 and plugs the avoiding hole 762. The electronic component 71 is provided on the side of the heat dissipation fixing plate 74 away from the heat exchange body 61, so that the heat dissipation fixing plate 74 can be configured for thermally connecting the electronic component 71 to the heat exchange body 61. The heat dissipation fixing plate 74 can be configured for separating the first cavity 7212 from the second cavity 7214, so as to prevent the condensed water from flowing into the second cavity 7214 provided with the electronic component 71 through the avoiding hole 762, and further prevent the condensed water from contacting with the electronic component 71.

Furthermore, when more condensed water is generated on the heat exchange body 61, the condensed water can fall down under the action of gravity after being accumulated, and the dripped condensed water is easy to sputter, so that hidden troubles are brought to circuits in the electric control box 7, and the dispersed condensed water is not favorable for being discharged out of the electric control box 7.

Thus, as shown in FIG. 35, a deflector 77 can be disposed in the electric control box 7. The deflector 77 is disposed below the heat sink 6 and configured for collecting the condensed water dripping from the heat sink 6, so that the dripping height of the condensed water can be reduced, and the sputtering of the condensed water can be avoided. The deflector 77 also has a certain accumulation effect on the condensed water, so that the condensed water can be conveniently discharged out of the electric control box 7 after being converged.

As shown in FIG. 35, the deflector 77 is fixed on the bottom plate 723 of the electric control box 7. One end of the deflector 77 is connected to the bottom plate 723, the other end of the deflector 77 extends into the first cavity 7212. The projection of the heat sink 6 along the vertical direction is on the deflector 77, in some embodiments, entire projection of the heat sink 6 along the vertical direction falls on the deflector 77, so that condensed water dripping from the heat sink 6 can be located on the deflector 77, and is prevented from dripping to other positions of the electric control box 7.

The heat sink 6 may also be disposed on the mounting plate 76. One end of the deflector 77 is connected to the mounting plate 76, and the other end of the deflector 77 extends into the first cavity 7212. The projection of the heat sink 6 in the vertical direction falls on the deflector 77.

Figure 36:
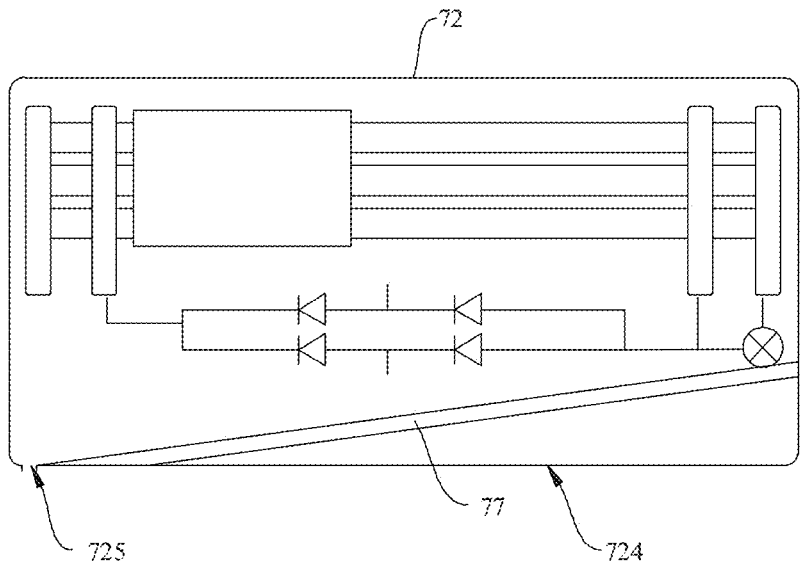
FIG. 36 is a structure schematic view of some embodiments of a deflector of FIG. 35.

Further, as shown in FIG. 36, in order to facilitate and timely discharge of the condensed water on the deflector 77 from the electric control box 7, a water outlet 725 can be formed in the bottom wall of the box body 72. The deflector 77 is obliquely disposed relative to the bottom wall of the box body 72, and the condensed water is guided by the deflector 77 and then discharged out of the box body 72 through the water outlet 725.

In some embodiments, the water outlet 725 can be formed in the circumferential side plate 724 of the electric control box 7. The deflector 77 is connected to the mounting plate 76 or the bottom plate 723 of the box body 72 and is obliquely disposed in the direction of the water outlet 725. After condensed water drips on the deflector 77, the condensed water can converge to the position of the water outlet 725 along the oblique deflector 77 and then is discharged out of the electric control box 7 through the water outlet 725.

The number and the size of the water outlet 725 can be flexibly set according to the amount of condensed water, and the embodiment of the present disclosure is not specifically limited.

In this embodiment, the flowing direction of the refrigerant flow in the heat exchange body 61 can be set horizontally. That is, the extending direction of the heat exchange body 61 is disposed along the horizontal direction. On one hand, the flowing path of the condensed water on the heat exchange body 61 can be shortened, so that the condensed water drips on the deflector 77 as soon as possible under the action of gravity, the condensed water can be conveniently discharged out of the electric control box 7 in time, and the condensed water is prevented from being contacted with the electronic component 71 disposed in the mounting cavity 721. On the other hand, interference between the deflector 77 and the heat exchange body 61 can be avoided, so that a relatively long heat exchange body 61 can be disposed, and the heat exchange efficiency of the heat sink 6 can be improved.

Figure 37:
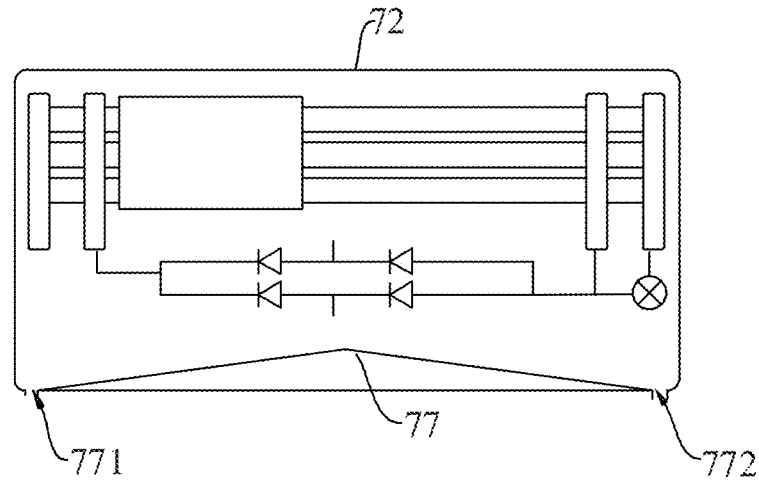
FIG. 37 is a structural schematic view of some embodiments of the deflector of FIG. 35.

In some embodiments, as shown in FIG. 37, in a direction from a middle area of the deflector 77 to two ends, the height of the deflector 77 gradually decreases in the vertical direction, so as to make the condensed water dripped on the deflector 77 flow to two ends of the deflector 77. That is, the deflector 77 is disposed in an inverted V shape. In this way, the overall height of the deflector 77 along the vertical direction can be reduced, the interference between the deflector 77 and other parts in the electric control box 7 can be avoided, and the condensed water dripped on the deflector 77 by the heat sink 6 can be quickly discharged.

Further, as shown in FIG. 37, the box body 72 is provided with a first water outlet 771 and a second water outlet 772 that correspond to the positions of the two ends of the deflector 77 respectively, so that the condensed water flowing to the two ends of the deflector 77 is discharged. The condensed water dripped on the deflector 77 flows to the two ends of the deflector 77, and is discharged out of the box body 72 through the first water outlet 771 and the second water outlet 772.

Figure 38:
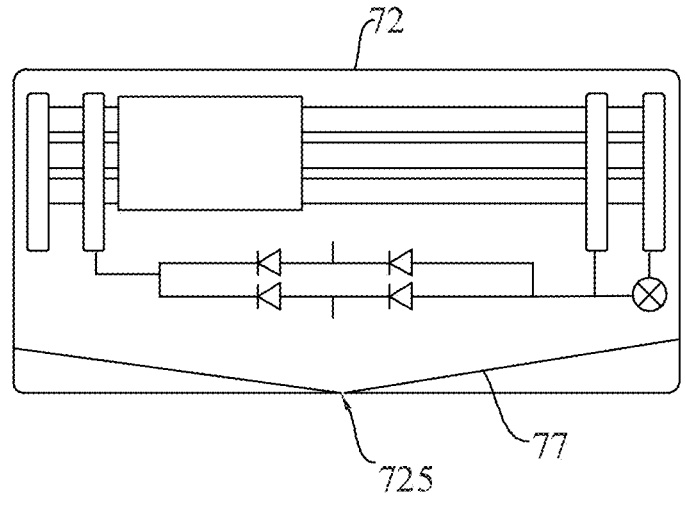
FIG. 38 is a structural schematic view of some embodiments of the deflector of FIG. 35.

In some embodiments, as shown in FIG. 38, in a direction from the middle area of the deflector 77 to two ends, the height of the deflector 77 is gradually increased in the vertical direction, so that the condensed water dripping on the deflector 77 flows to the middle area of the deflector 77. That is, the deflector 77 can be disposed in a V shape. In this way, the condensed water can be collected to the middle area of the deflector 77 through the deflector 77 and can be discharged from the middle area.

Further, as shown in FIG. 38, the box body 72 is provided with the water outlet 725 corresponding to the position of the middle area of the deflector 77, so as to discharge the condensed water flowing to the middle area of the deflector 77, which facilitates collection and drainage of condensed water.

The number and the size of the water outlets 725, the first drain outlet 771 and the second drain outlet 772 can be flexibly set according to the amount of condensed water, and the embodiment of the present disclosure is not specifically limited.

The deflector 77 described above may be disposed below the heat sink 6, wherein the heat sink 6 may be installed in the electronic control box 7 in other ways and configured to dissipate heat from the electronic components 71 in the electronic control box 7. This disclosure is not limited to the embodiments described above.

Figure 39:
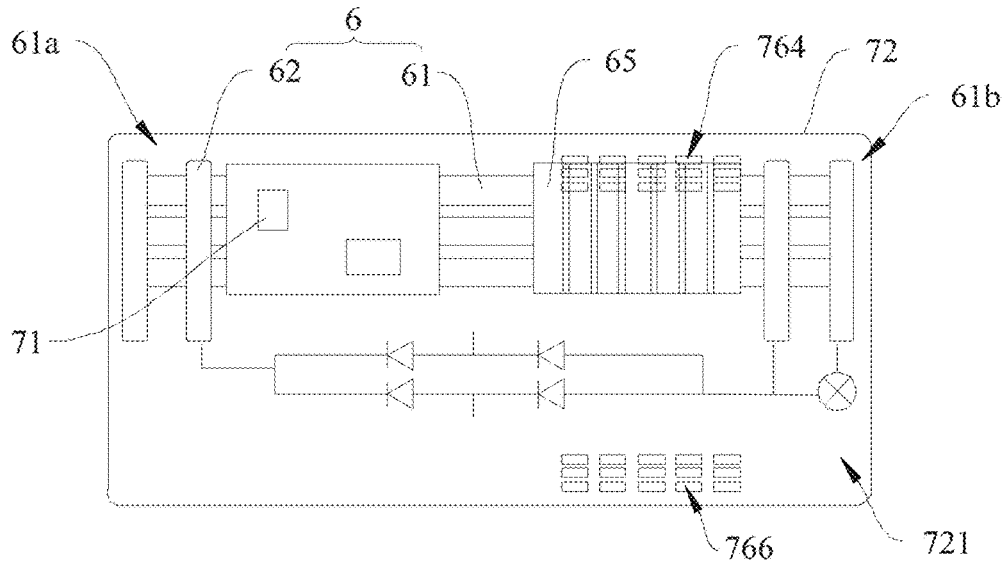
FIG. 39 is a plane structural schematic view of some embodiments of the coordination between the heat sink and the electronic control box of the present disclosure.

8. Electronic Component is Disposed in Upstream of Heat Sink and Heat Dissipation Fins are Disposed in Downstream of Heat Sink As shown in FIG. 39, the box body 72 is provided with the mounting cavity 721, and at least a portion of the heat exchange body 61 is disposed in the mounting cavity 721. The electronic component 71 is thermally connected to the heat exchange body 61 at a first position. The heat dissipation fins 65 are thermally connected to the heat exchange body 61 at a second position. The first position and the second position are spaced apart from each other along the flowing direction of the refrigerant flow of the heat exchange body 61. As described above, the refrigerant flow referred to herein may be either the main refrigerant flow of the air conditioning system shown in FIGS. 1 to 4 or the auxiliary refrigerant flow.

In this embodiment, the electronic component 71 and the heat dissipation fins 65 are spaced apart from each other along the flowing direction of the refrigerant flow of the heat exchange body 61, so that the space on the heat exchange body 61 can be fully utilized. Not only the heat exchange body 61 can be utilized to dissipate the heat of the electronic component 71, but also the heat dissipation fins 65 can be utilized to reduce the temperature in the mounting cavity 721 of the electric control box 7, thereby protecting the electronic component 71 disposed in the mounting cavity 721.

Further, the heat exchange body 61 includes the first end 61a and the second end 61b that are spaced apart from each other in the flowing direction of the refrigerant flow. The temperature of the heat exchange body 61 gradually decreases in the direction from the first end 61a to the second end 61b. That is, the temperature of the first end 61a is greater than the temperature of the second end 61b, and the first position is closer to the first end 61a than the second position.

In some embodiments, during operation of the heat exchange body 61, the temperature of the surface of the heat exchange body 61 varies with the flowing direction of the refrigerant flow, further forming the first end 6A with a higher temperature and the second end 61b with a lower temperature. The temperature difference between first end 6A with the higher temperature and the hot air in the mounting cavity 721 is small, it is not easy to generate the condensed water. Thus, the electronic component 71 may be disposed close to the first end 6A. That is, the first position is close to the first end 6A. The temperature difference between the second end 61*b* with the lower temperature and the hot air in the mounting cavity 721 is large, it is easy to generate the condensed water. Thus, the heat dissipation fins 65 may be disposed close to the second end 61*b*. On one hand, the heat dissipation fins 65 with lower temperature can ensure that the temperature difference between the heat dissipation fins 65 and the hot air is large enough, to dissipating heat from the electronic control box 7. On the other hand, the condensed water formed by condensation on the heat dissipation fins 65 can be evaporated under the action of hot air, and the condensed water is evaporated to absorb heat, so that the temperature of refrigerant flow is further reduced, and the heat exchange effect of the heat sink 6 is improved.

8.1 Accelerating Flow Rate of Heat Dissipation Airflow

Figure 40:
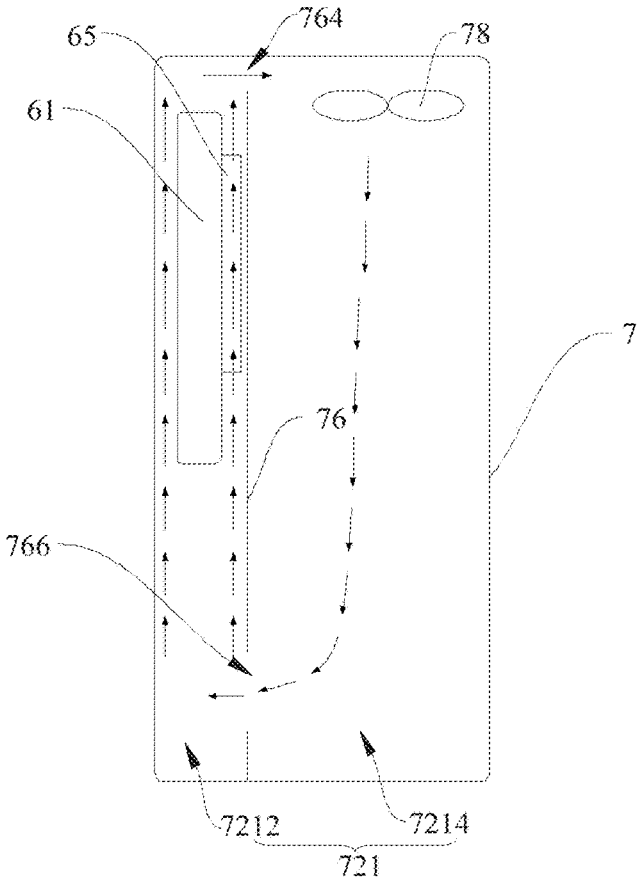
FIG. 40 is a cross-sectional structural schematic view of the coordination between the heat sink and the electronic control box of FIG. 39.

Furthermore, as shown in FIG. 40, a cooling fan 78 can also be disposed in the electric control box 7, and the cooling fan 78 is configured to form a heat dissipation airflow acting on the heat dissipation fins 65 in the electric control box 7, so that the flowing speed of the heat dissipation airflow can be accelerated, and the heat exchange effect is further in/proved.

In some embodiments, the cooling fan 76 may be disposed close to the heat dissipation fins 65 to act directly on the heat dissipation fins 65.

In some embodiments, as shown in FIG. 40, the mounting plate 76 may also be disposed in the electric control box 7. The mounting plate 76 is disposed in the mounting cavity 721, such that the mounting cavity 721 forms the first cavity 7212 and the second cavity 7214 on two sides of the mounting plate 76. A first vent 764 and a second vent 766 are formed in the mounting plate 76, and spaced apart from each other, so that the air in the first cavity 7212 flows into the second cavity 7214 through the first vent 764, and the air in the second cavity 7214 flows into the first cavity 7212 through the second vent 766. At least part of the heat exchange body 61 is located in the first cavity 7212, and the electronic component 71 and the cooling fan 78 are disposed in the second cavity 7214.

The mounting cavity 721 is divided into the first cavity 7212 and the second cavity 7214 that are independent of each other by the mounting plate 76. The circulating airflow can be formed in the first cavity 7212 and the second cavity 7214 to increase the volume of the air that contact with the heat dissipation fins 65 disposed in the first cavity 7212. The cooled airflow can conveniently dissipate the heat of the electronic component 71 disposed in the second cavity 7214, so that the mixed flow of the air is avoided, and the heat dissipation efficiency of the heat dissipation fins 65 is improved.

The cooling fan 78 disposed in the second cavity 7214 is configured to accelerate the flowing speed of air in the second cavity 7214, so that the circulating speed of the air between the first cavity 7212 and the second cavity 7214 is accelerated, and the heat dissipation efficiency of the electric control box 7 is improved.

Further, the flowing direction of the heat dissipation airflow that flows through the heat dissipation fins 65 may be perpendicular to the flowing direction of the refrigerant flow.

As shown in FIGS. 39 and 40, when the refrigerant flow in the heat exchange body 61 is in the horizontal direction, the heat dissipation airflow may be configured to flow in the vertical direction to prevent the heat dissipation airflow from flowing to the position where the electronic component 71 is located.

In some embodiments, the first vent 764 and the second vent 766 may be vertically spaced apart from each other on two opposite sides of the heat dissipation fin 65, and the number and arrangement density of the first vent 764 and the second vent 766 may be set according to need.

In some embodiments, when the refrigerant flow in the heat exchange body 61 is in the vertical direction, the heat dissipation airflow can be set to flow in the horizontal direction to prevent the heat dissipation airflow from flowing to the position where the electronic component 71 is located. Or the flowing direction of the heat dissipation airflow and the flowing direction of the refrigerant flow can also be set to be in the other two mutually perpendicular directions, the embodiments of the present disclosure are not specifically limited.

Further, when the first vent 764 and the second vent 766 are vertically disposed, the first vent 764 may be disposed above the second vent 766, such that the hot air entering the first cavity 7212 through the second vent 766 automatically rises to the position where the heat exchange body 61 is located, and exchanges heat with the heat exchange body 61.

In some embodiments, the cooling fan 78 may be close to the first vent 764 to facilitate timely entry of the cold air at the top of the first cavity 7212 into the second cavity 7214, and the cooling fan 78 may accelerate the cold air to enhance the heat dissipation efficiency of the electronic component 71.

9. Internal Circulation

Typically, in order to cool the electric control box 7, the box body 72 of the electric control box 7 is generally provided with the heat dissipation holes communicated with the mounting cavity 721, to naturally convection heat with the external air through the heat dissipation holes, thereby cooling the electronic control box 7. However, the sealing performance of the electric control box 7 is reduced by disposing the heat dissipation holes on the box body 72, so that impurities such as outside moisture and dust can enter the mounting cavity 721 through the heat dissipation holes, and further electronic components disposed in the mounting cavity 721 are damaged.

Figure 41:
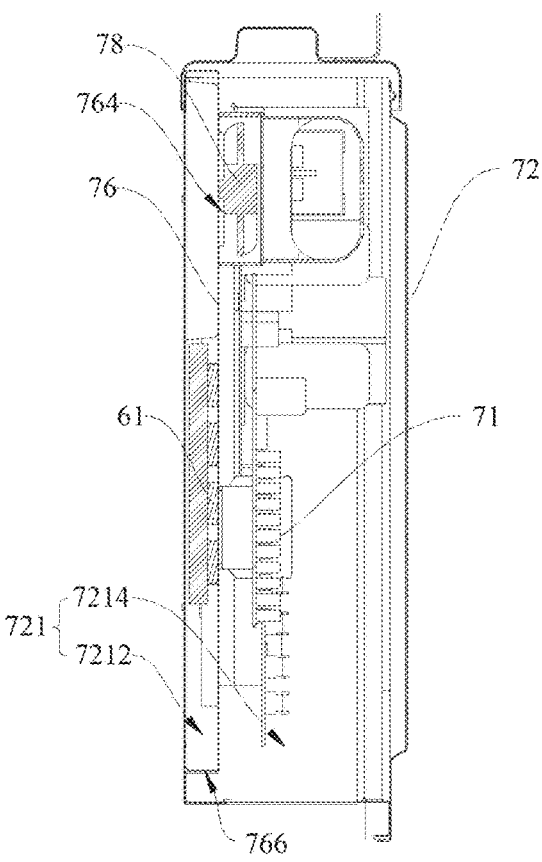
FIG. 41 is a cross-sectional structural schematic view of the coordination between the heat sink and the electronic control box of some embodiments of present disclosure.

In order to solve the problems, the box body 72 of the electric control box 7 can be disposed into a sealing structure, and In some embodiments, as shown in FIG. 41, the electric control box 7 includes the box body 72, the mounting plate 76, the heat sink 6, the electronic component 71 and the cooling fan 78.

The box body 72 is provided with the mounting cavity 721, and the mounting plate 76 is disposed in the mounting cavity 721, such that the mounting cavity 721 forms the first cavity 7212 and the second cavity 7214 on two sides of the mounting plate 76. The mounting plate 76 is provided with the first vent 764 and the second vent 766 spaced apart from each other, and the first vent 764 and the second vent 766 communicate with the first cavity 7212 and the second cavity 7214. The heat sink 6 is disposed at least partially in the first cavity 7212. The electronic component 71 is disposed in the second cavity 7214 and thermally connected to the heat sink 6. The cooling fan 78 is adapted to supply wind, such that air in the first cavity 7212 flows into the second cavity 7214 through the first vent 764.

In this embodiment, the heat sink 6 is disposed at least partially in the first cavity 7212, and the electronic component 71 and the heat dissipation fan 78 are disposed in the second cavity 7214. The first vent 764 and the second vent 766 spaced apart from each other and communicating with the first cavity 7212 and the second cavity 7214 are formed in the mounting plate 76. Thus, the electronic component 71 generates heat to cause the temperature of the air in the second cavity 7214 to be higher. The cooling fan 78 supplies the hot air to the second vent 766. Because the density of the hot air is small, the hot air naturally rises to contact with the heat sink 6 disposed in the first cavity 7212. The heat sink 6 is used for cooling the hot air to form cold air, and the cold air flows into the second cavity 7214 from the first vent 764. The cooling fan 78 is used for accelerating the cold air, so as to cool the electronic component 71 disposed in the second cavity 7214 with cold air. The temperature of the cold air after heat exchange with the electronic component 71 is increased. The cold air with the increased temperature further continues to enter the second vent 766 under the action of the cooling fan 78. By means of the circulation, the electronic component 71 disposed in the electric control box 7 is cooled in an internal circulation mode. Compared with the mode that the electric control box 7 is provided with the heat dissipation holes for cooling, the electric control box 7 is a totally-enclosed electric control box 7, so that the problems of water prevention, insect prevention, dust prevention, moisture prevention and the like can be effectively solved, and the electric control reliability of the electric control box 7 is improved.

Figure 42:
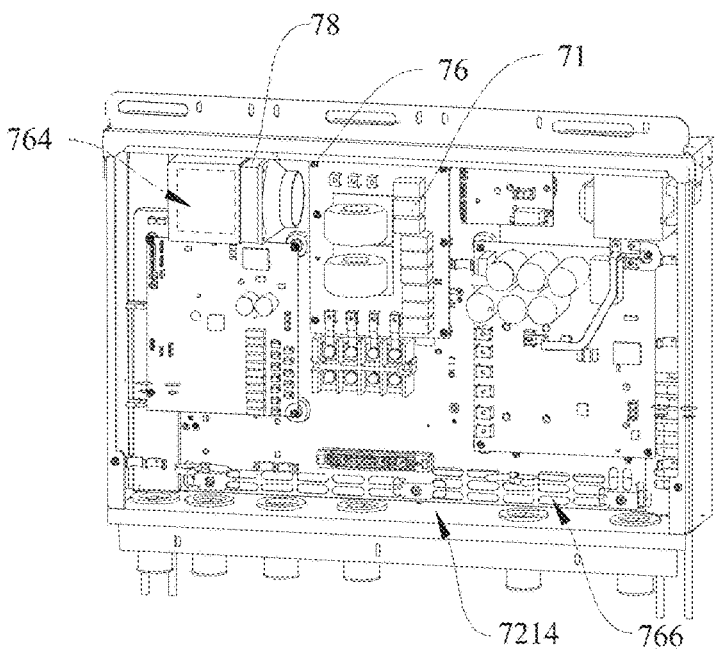
FIG. 42 is a three-dimensional structure schematic view of the electronic control box with a portion of the components removed in some embodiments of present disclosure.

In some embodiments, as shown in FIG. 42, the plane where the cooling fan 78 is located is perpendicular to the plane where the mounting plate 76 is located, and the leeward side of the cooling fan 78 is disposed toward the first vent 764.

In some embodiments, the cooling fan 78 may be disposed on one side of the mounting plate 76 facing the second cavity 7214. The direction of the rotating shaft of the cooling fan 78 is parallel to the plane where the mounting plate 76 is located. The leeward side of the cooling fan 78 refers to the air intake side of the cooling fan 78. In the embodiment, the cooling fan 78 can be disposed between the first vent 764 and the electronic component 71, and the cold air entering the second cavity 7214 through the first vent 764 flows out after being accelerated by the cooling fan 78, so that the flowing speed of the cold air is increased, and the heat dissipation efficiency of the electric control box 7 is improved.

Figure 43:
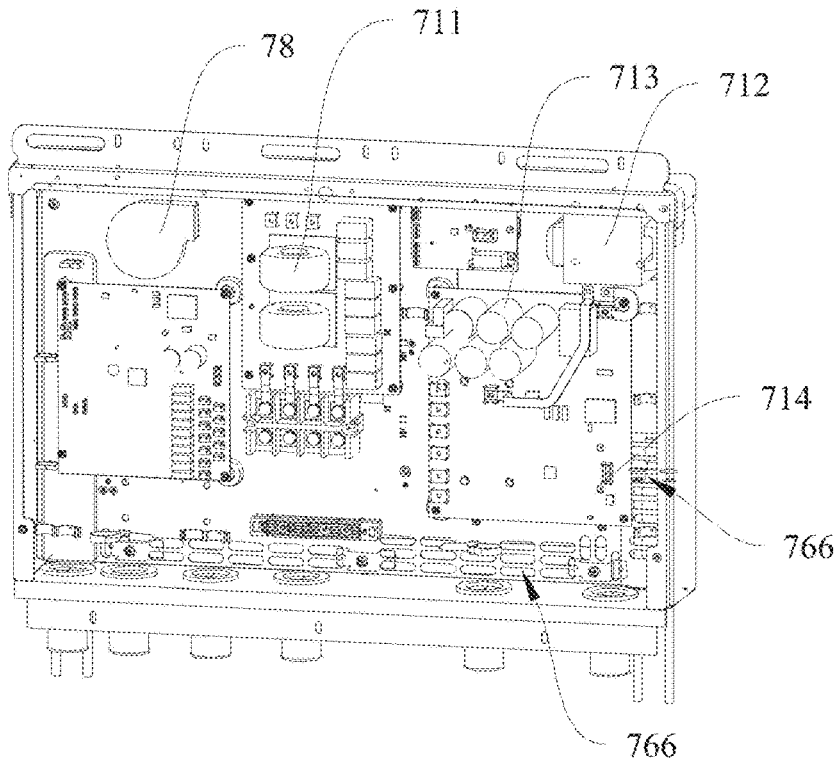
FIG. 43 is a three-dimensional structure schematic view of the electronic control box with a portion of the components removed in some embodiments of present disclosure.

In some embodiments, as shown in FIG. 43, the cooling fan 78 may also be configured as a centrifugal fan.

The centrifugal fan is a mechanical device that relies on input mechanical energy to increase gas pressure and exhaust gas. The working principle of the centrifugal fan is to use a high-speed rotating impeller to accelerate the gas. Therefore, in this embodiment, by setting the cooling fan 78 as the centrifugal fan, on one hand, the high-speed cold air can be obtained, and the heat dissipation efficiency of the electronic component 71 can be improved; and on the other hand, the centrifugal fan can simplify the structure of the cooling fan 78 and improve the mounting efficiency.

The air deflectors (not shown) may also be spaced apart from each other on the mounting plate 76, and the air guide flow passages may be formed between the air deflectors for guiding the air blown by the cooling fan 78.

In some embodiments, two air deflectors that are parallel to and spaced apart from each other may be provided between the dispersedly disposed electronic components 71. The extending directions of the air deflectors are along the spacing direction of the electronic component 71, so that the air guide flow passage along the spacing direction of the electronic component 71 is defined between the two air deflectors. The cold air blown by the heat dissipation fan 78 first flows to the position where a part of the electronic component 71 is located, so as to dissipating heat from the electronic component 71. The air passing through the part of the electronic component 71 further flows to the position where the other part of the electronic component 71 is located through the air guide flow passage, so as to dissipating heat from the other part of the electronic component 71. Therefore, the heat dissipation of the electronic component 71 is more balanced to avoid damage caused by excessive temperature in local electronic components 71.

The heat sink 6 can be disposed in the electric control box 7, that is, the heat exchange body 61 can be disposed in the first cavity 7212 for cooling the air in the first cavity 7212.

In some embodiments, the heat sink 6 can be disposed outside of the electric control box 7, and at least part of the heat sink 6 extend into the first cavity 7212. In some embodiments, in the case where the heat sink 6 includes the heat exchange body 61, the collecting tube assembly 62, and the heat dissipation fins 65, the assembly port (not shown) communicating with the first cavity 7212 may be formed in the box body 72. At this time, the heat exchange body 61 is connected to the outer side wall of the box body 72, and the heat dissipation fins 65 are connected to the heat exchange body 61 and inserted into the first cavity 7212 through the assembly port 726.

The matching mode of the heat sink 6 and the electric control box 7 in this embodiment is the same as the matching mode of the heat sink 6 and the electric control box 7 in the above embodiment. Referring to the description in the above embodiment and will not be repeated here.

As shown in FIG. 43, the electronic component 71 may be disposed in the blowing range of the cooling, fan 78, so that the cooling fan 78 directly acts on the electronic component 71 to cool the electronic component 71.

The electronic component 71 may include a primary heating element having a large calorific value, such as a common mode inductor 711, a reactance 712 and a capacitor 713; and a secondary heating element having a small calorific value, such as a fan module 714. In order to improve the heat dissipation efficiency of the primary heating element, the distance between the primary heating element and the first vent 764 may be set to be less than the distance between the secondary heating element and the first vent 764. That is, the primary heating element having the large calorific value can be disposed close to the first vent 764, and the secondary heating element having the small calorific value is disposed away from the first vent 764. Thus, the lower temperature air entering through the first vent 764 first acts on the primary heating element having the large calorific value, so as to improve the heat dissipation efficiency of the primary heating element having the large calorific value.

In some embodiments, the second vent 766 may be disposed at the end of the blowing of the cooling fan 78, and close to the electronic component 71 with the large calorific value. On one hand, the radiation range of the cooling fan 78 can be enlarged, and the circulation efficiency of air in the second cavity 7214 can be improved. On the other hand, the hot air after heat exchange with the electronic component 71 having the large calorific value can be discharged out of the second cavity 7214 in time, so that the temperature of the whole second cavity 7214 is prevented from being increased.

Further, the second vent 766 can be disposed close to the first vent 764 to shorten the circulation path of air in the second cavity 7214, reduce the air flow resistance, improve the air circulation efficiency, and further improve the heat dissipation efficiency of the electric control box 7.

Further, the dimensions of the first vent 764 and the second vent 766 may also be set according to the arrangement of the electronic components 71.

In some embodiments, the number of second vents 766 may be multiple. A plurality of second vents 766 may be disposed at different position on the mounting plate 76, respectively. The size of the second vent 766 located at the position of the electronic component 71 having the large calorific value can be relatively larger, and the number of second vents 766 can also be set relatively larger, and the distribution density of multiple second vents 766 can be set relatively larger. The size of the second vent 766 located at the position of the electronic component 71 having the small calorific value can be relatively smaller, and the number of second vents 766 can also be set relatively smaller, and the distribution density of multiple second vents 766 can be set relatively smaller.

Further, the size of first vent 764 may be greater than that of the second vent 766 to increase return air volume and efficiency of the cooling fan 78.

10. Natural Convection

Figure 44:
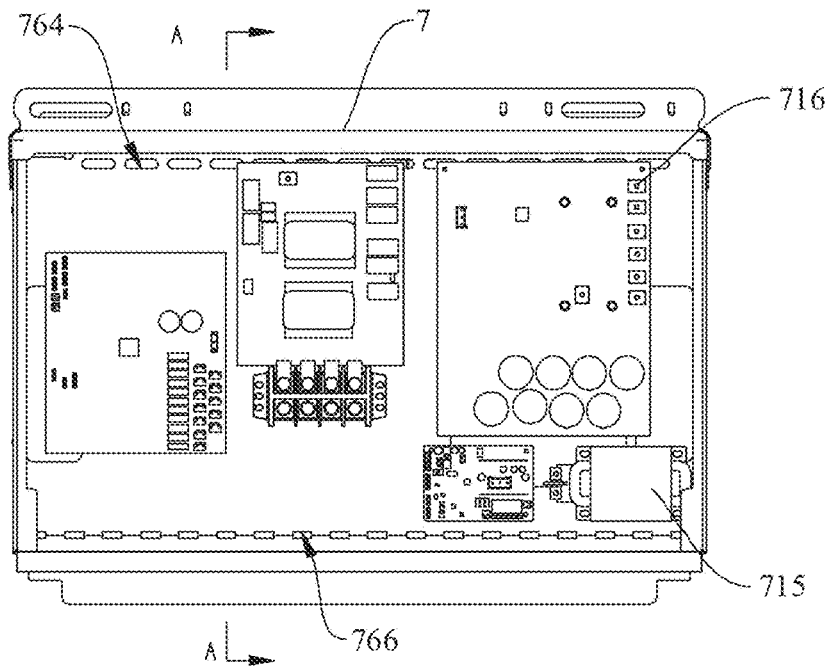
FIG. 44 is a plane structure schematic view of the electronic control box with a portion of the components removed in some embodiments of present disclosure.
Figure 45:
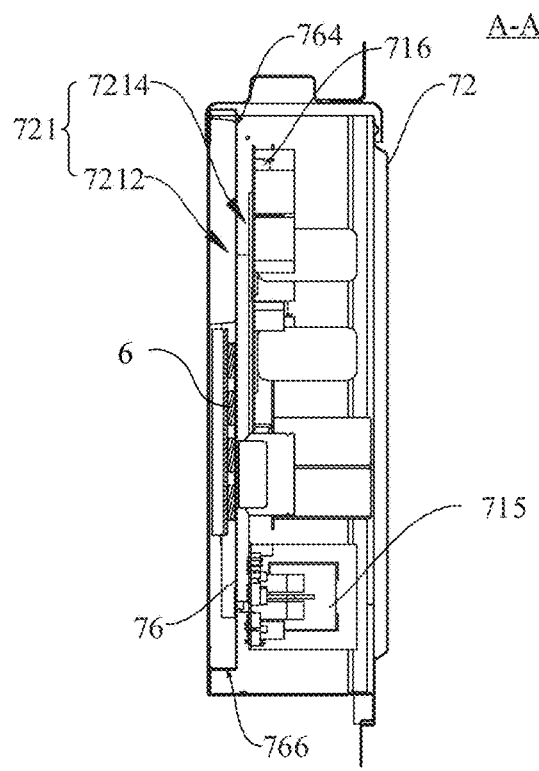
FIG. 45 is a cross-sectional structure schematic view of the electronic control box of FIG. 44.

Referring to FIGS. 44 and 45, in the present embodiment, the electronic control box 7 includes the box body 72, the mounting plate 76, the heat sink 6, and a primary heating element 715.

The box body 72 is provided with the mounting cavity 721, the mounting plate 76 is disposed in the mounting cavity 721, so that the mounting cavity 721 forms the first cavity 7212 and the second cavity 7214 that are disposed on two sides of the mounting plate 76. The mounting plate 76 is provided with the first vent 764 and the second vent 766 that are spaced apart from each other along the vertical direction. The heat sink 6 is disposed at least partially in the first cavity 7212. The primary heating element 715 is disposed in the second cavity 7214. The first vent 764 and the second vent 766 communicate with the first cavity 7212 and the second cavity 7214 to form the circulating heat dissipation airflow between the first cavity 7212 and the second cavity 7214 using the temperature difference between the primary heating element 715 and the heat sink 6.

In some embodiments, the primary heating element 715 is disposed in the second cavity 7214. The heat generated by the operation of the primary heating element 715 causes the temperature in the second cavity 7214 to rise. Because the density of the hot air is small, the hot air naturally rises and enters the first cavity 7212 through the first vent 764 in the top of the second cavity 7214. The hot air contacts with the heat sink 6 and exchanges heat with the heat sink 6. The temperature of the hot air is reduced, and the density of the hot air is increased. The hot air naturally sinks to the bottom of the first cavity 7212 under the action of gravity, and enters the second cavity 7214 through the second vent 766 for cooling the primary heating element 715 disposed in the second cavity 7214. After heat exchange with the primary heating element 715, the hot air further rises to the position of the first vent 764, thereby forming an internal circulating air flow between the first cavity 7212 and the second cavity 7214.

In the present embodiment, the first vent 764 and the second vent 766 communicating with the first cavity 7212 and the second cavity 7214 are formed in the mounting plate

76, and the first vent 764 and the second vent 766 are disposed in a vertical direction. The circulation flow between the first cavity 7212 and the second cavity 7214 is achieved by utilizing the gravity of the air, thereby cooling the electronic component 71 disposed in the second cavity 7214, and reducing the overall temperature of the electric control box 7. Compared with the mode of adopting the cooling fan 78 to supply wind, the structure of the electric control box 7 in the embodiment is more concise, the assembly efficiency of the electric control box 7 can be improved, and the production cost of the electric control box 7 can be reduced.

Further, the heat sink 6 may be disposed above the primary heating element 715 in the direction of gravity. That is, the heat sink 6 is disposed close to the top of the first cavity 7212, and the primary heating element 715 is disposed close to the bottom of the second cavity 7214. According this arrangement mode, the distance between the heat sink 6 and the first vent 764 can be reduced, so that the hot air entering the first cavity 7212 through the first vent 764 is quickly contacted with the heat sink 6 for cooling, and naturally sinks under the action of gravity. By reducing the distance between the primary heating element 715 and the second vent 766 the hot air entering the second cavity 7214 through the second vent 766 is quickly contacted with the primary heating element 715 to be heated, and naturally rises under the action of buoyancy. Thus, the circulation speed of airflow in the electric control box 7 can be increased, and the heat dissipation efficiency is improved.

Furthermore, as shown in FIG. 45, a secondary heating element 716 can be disposed in the electric control box 7. The secondary heating element 716 is disposed in the second cavity 7214 and thermally connected to the heat exchange body 61. The calorific value of the secondary heating element 716 is smaller than that of the primary heating element 715.

In some embodiments, in this embodiment, the primary heating element 715 having a large calorific value may be disposed close to the second vent 766. On one hand, the cold air entering through the first cavity 7212 may be first contacted with the heated electronic component 71, improving the heat dissipation efficiency of the electronic component 71. On the other hand, a large temperature difference between the cold air and the electronic component 71 with large calorific value can be realized, so that the cold air can be quickly heated, and then rapidly rises under the action of buoyancy. The secondary heating element 716 with small calorific value is disposed on the heat exchange body 61 and contacted with the heat exchange body 61, so that the heat exchange body 61 can be used for directly cooling the electronic component 71 with small calorific value. Thus, the primary heating element 715 with large calorific value and the secondary heating element 716 with small calorific value are disposed in different areas, so that the electronic component 71 can be reasonably distributed, and the internal space of the electric control box 7 can be fully utilized.

In some embodiments, the secondary heating element 716 is connected to the heat exchange body 61 through the heat dissipation fixing plate 74 to improve the assembly efficiency of the secondary heating element 716.

The connection of the secondary heating element 716 to the heat exchange body 61 may be the same as in the embodiments described above, and will not be described herein with specific reference to the embodiments described above.

In some embodiments, the heat sink 6 may be disposed outside of the electronic control box 7 and at least partially extend into the first cavity 7212.

The matching mode of the heat sink 6 and the electric control box 7 is the same as the matching mode of the heat sink 6 and the electric control box 7 in the embodiments described above, and reference is made to the description of the embodiments described above.

11. Drainage Sleeve is Disposed on Pipeline

Figure 46:
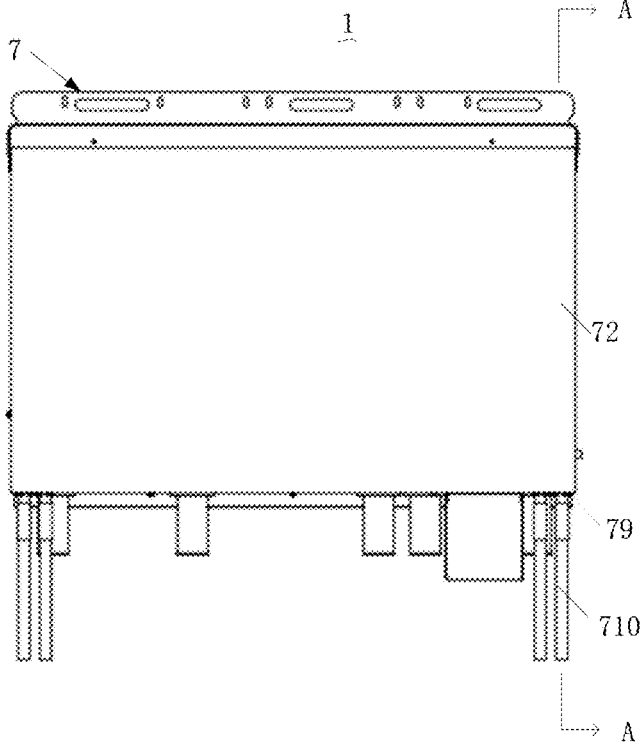
FIG. 46 is a structure schematic view of some embodiments of the air conditioning system of the present disclosure.
Figure 47:
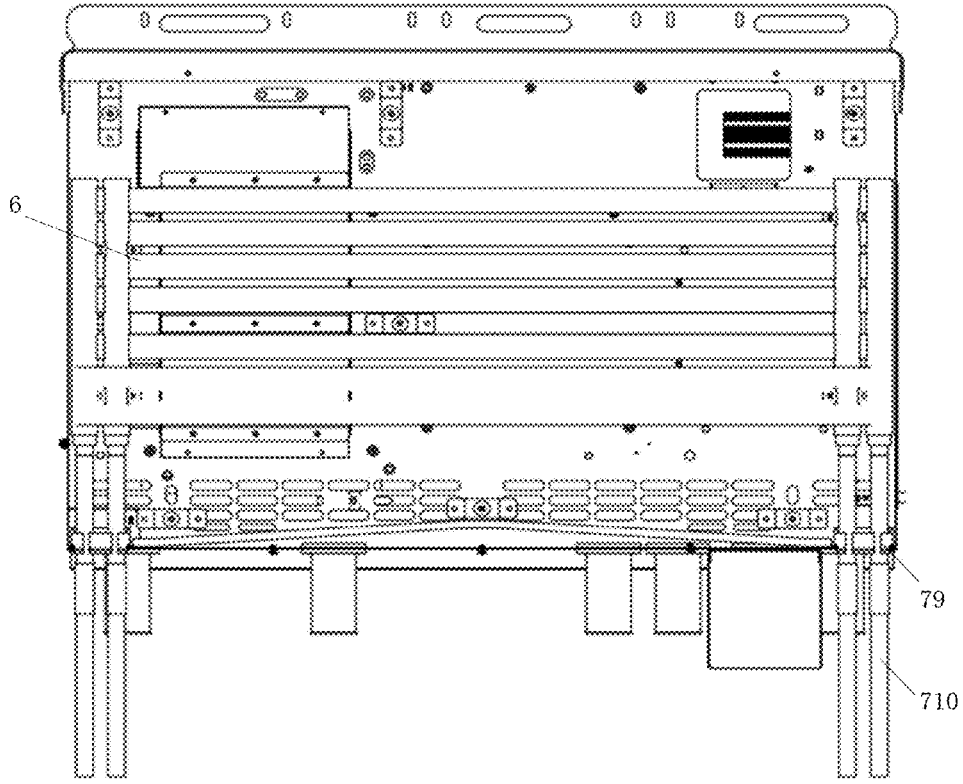
FIG. 47 is a structure schematic view of an interior structure of the air conditioning system of FIG. 46 with the box body removed.

As shown in FIGS. 46 and 47, the air conditioning system 1 of the present embodiment includes the heat sink 6, pipelines 710, and a drainage sleeve 79.

The pipelines 710 are configured to connect the heat sink 6, to provide the refrigerant flow to the heat sink 6 or collect the refrigerant flow out of the heat sink 6. In some embodiments, the pipeline 710 is connected to the collecting tube assembly 62 of heat sink 6.

The pipelines 710 may include an input line and an output line. The input line is configured to provide the refrigerant flow to the heat sink 6, and the output line is configured to collect the refrigerant flow in the heat sink 6.

The drainage sleeve 79 is sleeved on the pipelines 710, and is configured for drainage of the condensed water that is formed on the pipelines 710 or flows through the pipeline. The condensed water on the pipelines 710 can be guided by the drainage sleeve 79. The drainage sleeve 79 has the function of protecting the pipelines 710, improving the reliability of the air conditioning system 1.

Figure 48:
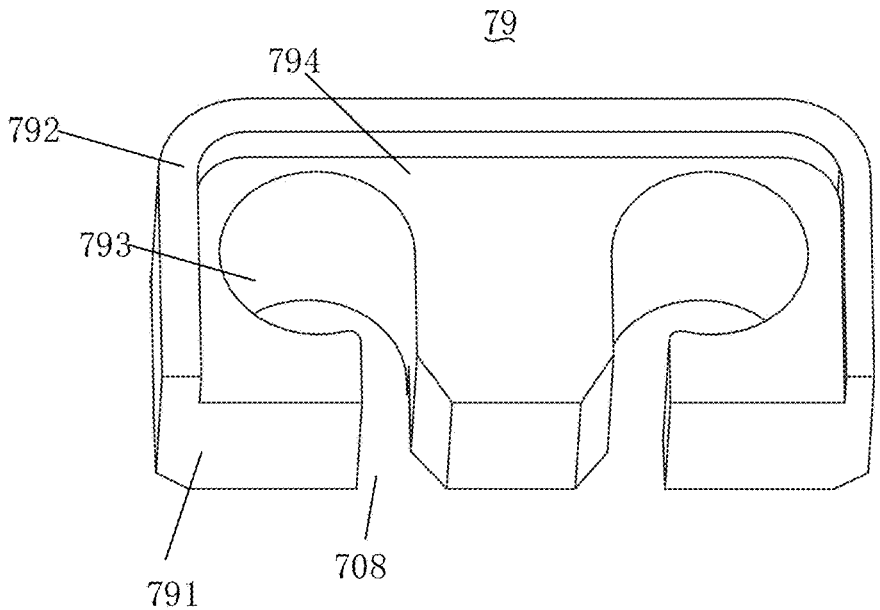
FIG. 48 is a structure schematic view of some embodiments of a drainage sleeve of FIG. 46.

In some embodiments, as shown in FIG. 48, the drainage sleeve 79 includes a sleeve body 791 and a flange 792.

The sleeve body 791 is provided with an insertion opening 793 and a drainage channel 708. The insertion opening 793 is configured to set the pipelines 710. The number and the size of the insertion opening 793 can be set according to the distribution and the size of the pipelines 710. In some embodiments, in the embodiment shown in FIG. 46, the number of the insertion openings 793 is two. In other embodiments, the number of the insertion opening 793 can be one or three, and the like.

The sleeve body 791 may be made of a flexible material, such as thermoplastic polyurethane elastomer rubber, so as to protect the pipelines 710, and prevent the pipeline 710 that contact with the electrical control box sheet metal during vibration from being abrased.

The flange 792 is disposed on the end face of the sleeve body 791, and is located at the periphery of the insertion opening 793, and further is matched with the sleeve body 791 to form a water collecting groove 794. The water collecting groove 794 is configured to collect the condensed water on the pipelines 710. The drainage channel 708 is communicated with the water collecting groove 794 and is configured to discharge the condensed water in the water collecting groove 794. In the operation of the air conditioning system, the condensed water flows into the water collecting groove 794 of the drainage sleeve 79 along the pipelines 710, and then is discharged through the drainage channel 708 on the sleeve body 791.

As shown in FIG. 48, the outer side wall of the flange 792 is flush with the outer side wall of the sleeve body 791 to increase the volume of the water collecting groove 794, thereby facilitating the collection of condensed water.

The pipeline 710 may be disposed along the direction of gravity. The sleeve body 791 includes an upper end face and a lower end face opposite to each other. The flange 792 and the water collecting groove 794 are disposed on the upper end face of the sleeve body 791. The drainage channel 708 communicates with the upper end face and the lower end face of the sleeve body 791. The condensed water on the pipeline 710 can flow into the water collecting groove 794 under the action of gravity, and then be discharged through the drainage channel 708 connected to the water collecting groove 794. This mode can automatically discharge the condensed water on pipeline 710. In other embodiments, the pipeline 710 can also be tilted to adapt to different application scenarios.

As shown in FIG. 48, the drainage channel 708 is formed in the side wall of the sleeve body 791, and further communicates with the insertion opening 793 and the outer side surface of the sleeve body 791, so as to allow the pipeline 710 to be inserted into the insertion opening 793 through the drainage channel 708. On one hand, the drainage sleeve 79 can be sleeved on the pipelines 710 through the drainage channel 708, so that the drainage sleeve 79 and the pipelines 710 can be assembled conveniently; and on the other hand, the condensed water in the water collecting groove 794 can be discharged through the drainage channel 708, so that the structure of the drainage sleeve 79 is simplified. The size of the drainage channel 708 can be selected according to the amount of the condensed water, and no specific limitation is made here.

In some embodiments, the flange 792 has an opening on one side of the drainage channel 708, so as to allow the pipeline 710 to enter the water collecting groove 794 through the opening, which facilitates the assembly of the drainage sleeve 79.

Figure 50:
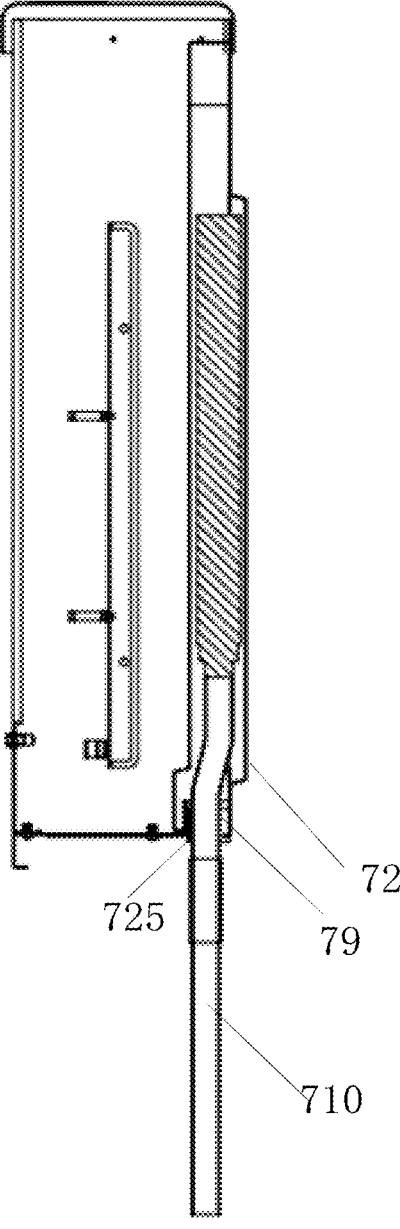
FIG. 50 is a cross-sectional structure schematic view of the air conditioning system of FIG. 46 in the A-A direction.

As shown in FIGS. 46 and 50, the air conditioning system 1 further includes the electric control box 7. The electric control box 7 includes the box body 72, and the heat sink 6 is disposed in the box body 72. In some embodiments, the box body 72 is provided with the water outlet 725, and the drainage sleeve 79 is embedded in the water outlet 725. The condensed water in the electric control box 7 can be collected in the water collecting groove 794 of the drainage sleeve 79 and discharged through the drainage channel 708. Thus, the discharge of the condensed water is facilitated, the electric control box 7 can be sealed through the drainage sleeve 79, and the reliability of the electric control box 7 is improved.

The sleeve body 791 and the flange 792 are abutted with the box body 72. The openings on the drainage channel 708 and the flange 792 are located on the abutted side of the sleeve body 791 and the box body 72. The openings on the drainage channel 708 and the flange 792 are located on the abutted side of the flange 792 and the box body 72. Thus, the drainage channel 708 and the opening can be blocked from the side of the drainage sleeve 79 by the box body 72, so that the sealing performance of the electric control box 7 can be improved, and area of communication with the electric control box 7 with the outside world can be reduced.

Figure 49:
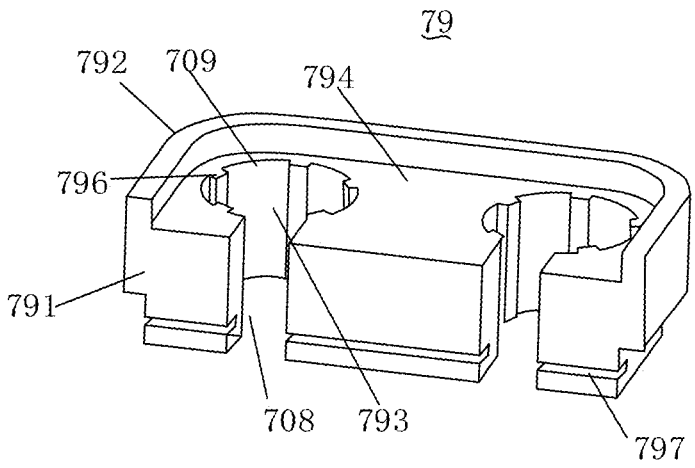
FIG. 49 is a structural schematic view of some embodiments of the drainage sleeve of FIG. 46.

In some embodiments, as shown in FIG. 49, this embodiment differs from the embodiment shown in FIG. 48 in that: a plurality of convex ribs 796 is disposed in the insertion opening 793, the plurality of convex ribs 796 are spaced apart from each other and around the pipeline 710, and the plurality of convex ribs 796 abuts against the pipeline 710, so as to further form a drainage channel 709 between the plurality of convex ribs 796. The water collecting groove 794 communicates with the drainage channel 709, and the condensed water collected in the water collecting groove 794 may also be discharged through the drainage channel 709. In the embodiment shown in FIG. 49, the drainage sleeve 79 is provided with the drainage channel 708 and the drainage passage 709 at the same time. In this way, the discharge of the condensed water in the water collecting groove 794 is facilitated, and the condensed water in the water collecting groove 794 is prevented from overflowing. The convex ribs 796 can be connected to the upper end face and the lower end face of the sleeve body 791. The number of the convex ribs 796 can be two, three, four or five, and the like. The extending direction of the convex ribs 796 is the same as that of the pipelines 710, so that the discharge of the condensed water is facilitated.

The convex ribs 796 can be integrally formed with the sleeve body 791 to facilitate processing and make the structure of the drainage sleeve 79 more reliable. In other embodiments, the convex ribs 796 can also be adhered to the inner surface of the insertion opening 793. The number of convex ribs 796 can be selected and set according to the actual amount of the condensed water discharged, and there is no specific limit in this disclosure.

In other embodiments, the drainage sleeve 79 may be provided with only the drainage channel 709, rather than the drainage channel 708, to achieve discharge of the condensed water from the water collecting groove 794, and to simplify the structure of the drainage sleeve 79.

As shown in FIG. 49, the sleeve body 791 may also be provided with a fixing groove 797. The fixing groove 797 is configured to clamp with the box body 72, to fix the drainage sleeve 79. In some embodiments, the fixing groove 797 can be disposed on one side of the sleeve body 791 with the drainage channel 708 to facilitate the installation of the drainage sleeve 79. The fixing groove 797 can be configured to fix the drainage sleeve 79, preventing the drainage sleeve 79 from sliding on the pipeline 710. At the same time, the drainage sleeve 79 can fix the pipeline 710, thereby preventing the pipeline 710 from tilting under external forces, and improving the reliability of air conditioning system 1.

In the embodiment, the drainage sleeve 79 is sleeved on the pipelines 710 of the air conditioning system 1, so that the condensed water on the pipelines 710 can be drained, the pipelines 710 can be protected, the electric control box 7 can be sealed, and the reliability of the air conditioning system 1 is improved.

The structures of the embodiments described above may be used in combination with one another. It will be appreciated that other types of heat sinks 6 may be adopted in addition to the heat sinks 6 described previously, and the embodiments of the present disclosure are not specifically limited.

The present disclosure may include one or more beneficial effects as follows. In some embodiments, the electric control box of the present disclosure includes the box body, the electronic component and the heat exchanger, the electronic component is located in the mounting cavity of the box body, and the heat exchanger is configured to dissipate heat of the electronic component, and may increase the reliability of electric control box. In addition, arranging the deflector on the lower side of the heat exchanger may allow the condensed water dripped from the heat exchanger to be collected. By adopting this mode, in some embodiments, not only can the dripping height of the condensed water be reduced to avoid sputtering of the condensed water drops, the deflector may also accumulate the condensed water. The condensed water is discharged together after being converged, so that the condensed water is convenient to collect, and short circuits of electronic components may be avoided.

The foregoing description is merely embodiments of the present disclosure and is not intended to limit the scope of the present disclosure. Any equivalent structure or equivalent process transformation made using the description and accompanying drawings of this disclosure, or directly or indirectly applied in other related technical fields, are equally included in the scope of patent protection of this disclosure.

What is claimed is:

1. An electric control box, comprising:
 a box body provided with a mounting cavity;
 an electronic component disposed in the mounting cavity;
 a heat exchanger comprising a heat exchange body and a collecting tube assembly, wherein the collecting tube assembly is configured to provide a refrigerant flow for the heat exchange body, and the heat exchange body is configured to dissipate heat of the electronic component;
 a deflector disposed below the heat exchanger and configured to collect condensed water dripped from the heat exchanger; and
 a mounting plate located in the mounting cavity, the mounting cavity forms a first cavity and a second cavity located on two sides of the mounting plate, and the deflector is connected to the mounting plate or the box body.

2. The electric control box as claimed in claim 1, wherein a projection of the heat exchanger in a vertical direction falls on the deflector.

3. The electric control box as claimed in claim 1, wherein the heat exchange body is at least partially located in the mounting cavity, a bottom wall of the box body is provided with a water outlet, the deflector is located in the mounting cavity and configured to incline relative to the bottom wall of the box body, and the condensed water is guided by the deflector and discharged out of the box body through the water outlet.

4. The electric control box as claimed in claim 1, wherein a height of the deflector along a vertical direction gradually decreases from a middle area of the deflector to each of two opposite ends of the deflector, so that the condensed water dripped on the deflector flows to the two opposite ends of the deflector.

5. The electric control box as claimed in claim 4, wherein the box body is provided with a first water outlet and a second water outlet that respectively correspond to the two opposite ends of the deflector to discharge the condensed water flowing to the two opposite ends of the deflector.

6. The electric control box as claimed in claim 1, wherein a height of the deflector along a vertical direction gradually increases from a middle area of the deflector to each of two opposite ends of the deflector, so that the condensed water dripped on the deflector flows to the middle area of the deflector.

7. The electric control box as claimed in claim 6, wherein the box body is provided with a water outlet corresponding to a middle area of the deflector to discharge the condensed water flowing to the middle area of the deflector.

8. The electric control box as claimed in claim 1, wherein one side of the deflector is connected to the mounting plate, and the other side of the deflector extends toward the first cavity.

9. The electric control box as claimed in claim 1, wherein the heat exchange body extends along a horizontal direction.

10. The electric control box as claimed in claim 1, wherein the heat exchange body is provided with a plurality of first microchannels configured to allow a first refrigerant flow to flow, and a plurality of second microchannels configured to allow a second refrigerant flow to flow; and the second refrigerant flow is configured to absorb heat from the first refrigerant flow to subcool the first refrigerant flow, or the first refrigerant flow is configured to absorb heat from the second refrigerant flow to subcool the second refrigerant flow.

11. An electric control box, comprising:
a box body provided with a mounting cavity;
an electronic component disposed in the mounting cavity;
a heat exchanger comprising a heat exchange body and a collecting tube assembly, wherein the collecting tube assembly is configured to provide a refrigerant flow for the heat exchange body, and the heat exchange body is configured to dissipate heat of the electronic component;
a deflector disposed below the heat exchanger and configured to collect condensed water dripped from the heat exchanger; and
a pipeline and a drainage sleeve, wherein the pipeline is configured to connect the heat exchanger, so as to provide the refrigerant flow for the heat exchanger, and the drainage sleeve is sleeved on the pipeline and configured for drainage of the condensed water flowing through the pipeline.

12. The electric control box as claimed in claim 11, wherein the drainage sleeve comprises:
a sleeve body defining an insertion opening and a drainage channel, wherein the insertion opening is configured to set the pipeline; and
a flange located on an end face of the sleeve body and a periphery of the insertion opening, wherein the flange is matched with the sleeve body to form a water collecting groove, the water collecting groove is configured to collect the condensed water of the pipeline, and the drainage channel is communicated with the water collecting groove and configured to discharge the condensed water in the water collecting groove.

13. An air conditioning system, comprising:
an electric control box comprising:
a box body provided with a mounting cavity;
an electronic component disposed in the mounting cavity;
a heat exchanger comprising a heat exchange body and a collecting tube assembly, wherein the collecting tube assembly is configured to provide a refrigerant flow for the heat exchange body, and the heat exchange body is configured to dissipate heat of the electronic component;

a deflector disposed below the heat exchanger and configured to collect condensed water dripped from the heat exchanger; and
a mounting plate located in the mounting cavity, the mounting cavity forms a first cavity and a second cavity located on two sides of the mounting plate, and the deflector is connected to the mounting plate or the box body.

14. The air conditioning system as claimed in claim 13, wherein a projection of the heat exchanger in a vertical direction falls on the deflector.

15. The air conditioning system as claimed in claim 13, wherein the heat exchange body is at least partially located in the mounting cavity, a bottom wall of the box body is provided with a water outlet, the deflector is located in the mounting cavity and configured to incline relative to the bottom wall of the box body, and the condensed water is guided by the deflector and discharged out of the box body through the water outlet.

16. The air conditioning system as claimed in claim 13, wherein a height of the deflector along a vertical direction gradually decreases from a middle area of the deflector to two opposite ends of the deflector, so that the condensed water dripped on the deflector flows to the two opposite ends of the deflector.

17. The air conditioning system as claimed in claim 16, wherein the box body is provided with a first water outlet and a second water outlet that respectively correspond to two opposite ends of the deflector to discharge the condensed water flowing to the two opposite ends of the deflector.

18. The air conditioning system as claimed in claim 13, wherein a height of the deflector along a vertical direction gradually increases from a middle area of the deflector to two opposite ends of the deflector, so that the condensed water dripped on the deflector flows to the middle area of the deflector.

19. The air conditioning system as claimed in claim 18, wherein the box body is provided with a water outlet corresponding to a middle area of the deflector to discharge the condensed water flowing to the middle area of the deflector.

* * * * *